(12) United States Patent
Shin et al.

(10) Patent No.: US 10,331,033 B2
(45) Date of Patent: *Jun. 25, 2019

(54) HARDMASK COMPOSITION AND METHOD OF FORMING PATTERN USING THE HARDMASK COMPOSITION

(71) Applicant: Samsung Electronics Co., Ltd., Suwon-si, Gyeonggi-do (KR)

(72) Inventors: Hyeonjin Shin, Suwon-si (KR); Sangwon Kim, Seoul (KR); Seongjun Park, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/791,912

(22) Filed: Jul. 6, 2015

(65) Prior Publication Data

US 2016/0011511 A1 Jan. 14, 2016

(30) Foreign Application Priority Data

Jul. 4, 2014 (KR) .................. 10-2014-0083905

(51) Int. Cl.
*G03F 7/11* (2006.01)
*C08G 83/00* (2006.01)
(Continued)

(52) U.S. Cl.
CPC .............. *G03F 7/11* (2013.01); *C08G 83/001* (2013.01); *C08K 3/30* (2013.01); *C08K 3/38* (2013.01);
(Continued)

(58) Field of Classification Search
None
See application file for complete search history.

(56) References Cited

U.S. PATENT DOCUMENTS 4,550,015 A * 10/1985 Korb .................. C04B 35/524
264/29.1
4,679,054 A * 7/1987 Yoshikawa .............. B41J 2/395
346/139 C
(Continued)

FOREIGN PATENT DOCUMENTS

CN 102774824 * 11/2012
CN 102775786 * 11/2012
(Continued)

OTHER PUBLICATIONS

"Silane coupling agents", Dow Corning, 7 pages (2009).*
(Continued)

*Primary Examiner* — Martin J Angerbranndt
(74) *Attorney, Agent, or Firm* — Harness, Dickey & Pierce, P.L.C.

(57) ABSTRACT

A hardmask composition includes a first material including one of an aromatic ring-containing monomer and a polymer containing a repeating unit including an aromatic ring-containing monomer, a second material including at least one of a hexagonal boron nitride and a precursor thereof, a chalcogenide-based material and a precursor thereof, and a two-dimensional carbon nanostructure and a precursor thereof, the two-dimensional carbon nanostructure containing about 0.01 atom % to about 40 atom % of oxygen, and a solvent.

14 Claims, 8 Drawing Sheets

(51) Int. Cl.
*C08K 3/30* (2006.01)
*C08K 3/38* (2006.01)
*G03F 7/40* (2006.01)
*H01L 21/47* (2006.01)
*H01L 21/4757* (2006.01)
*G03F 7/09* (2006.01)

(52) U.S. Cl.
CPC ............... *G03F 7/094* (2013.01); *G03F 7/40* (2013.01); *H01L 21/47* (2013.01); *H01L 21/47573* (2013.01); *C08K 2003/3009* (2013.01); *C08K 2003/385* (2013.01)

(56) References Cited

U.S. PATENT DOCUMENTS

| | | | |
|---|---|---|---|
| 5,328,560 | A | 7/1994 | Hanawa et al. |
| 5,432,227 | A * | 7/1995 | Fujimura ............... C08K 13/02 523/222 |
| 6,031,756 | A | 2/2000 | Gimzewski et al. |
| 6,120,858 | A * | 9/2000 | Hirano .................. C03C 17/007 428/1.53 |
| 7,658,969 | B2 | 2/2010 | Kumar et al. |
| 7,803,715 | B1 | 9/2010 | Haimson et al. |
| 8,008,095 | B2 | 8/2011 | Assefa et al. |
| 8,071,485 | B2 | 12/2011 | Lee et al. |
| 8,258,346 | B2 | 9/2012 | Rajendran |
| 8,524,594 | B2 | 9/2013 | Horikoshi |
| 8,664,439 | B2 | 3/2014 | Lee et al. |
| 8,871,639 | B2 | 10/2014 | Chien et al. |
| 9,018,776 | B2 * | 4/2015 | Song ................ H01L 21/02118 106/287.26 |
| 9,562,169 | B2 | 2/2017 | Wang et al. |
| 9,583,358 | B2 * | 2/2017 | Kim ..................... H01L 21/324 |
| 9,666,602 | B2 | 5/2017 | Lee et al. |
| 2002/0051931 | A1 | 5/2002 | Mori et al. |
| 2003/0203314 | A1 * | 10/2003 | Sebald ................ H01L 21/0274 430/296 |
| 2005/0112383 | A1 | 5/2005 | Tanaka et al. |
| 2005/0250052 | A1 | 11/2005 | Nguyen |
| 2007/0026682 | A1 | 2/2007 | Hochberg et al. |
| 2007/0148557 | A1 * | 6/2007 | Takei ...................... C23C 18/02 430/4 |
| 2008/0032176 | A1 * | 2/2008 | Shimizu .............. C08G 59/3218 429/509 |
| 2009/0011204 | A1 | 1/2009 | Wang et al. |
| 2009/0140350 | A1 | 6/2009 | Zhu |
| 2009/0297784 | A1 * | 12/2009 | Xu ......................... G03F 7/039 428/172 |
| 2010/0055464 | A1 | 3/2010 | Sung |
| 2010/0086463 | A1 | 4/2010 | Rudhard et al. |
| 2010/0218801 | A1 | 9/2010 | Sung et al. |
| 2010/0316950 | A1 * | 12/2010 | Oguro ...................... G03F 7/094 430/270.1 |
| 2011/0014111 | A1 * | 1/2011 | Leugers ................ B82Y 30/00 423/415.1 |
| 2011/0210282 | A1 | 9/2011 | Foley |
| 2011/0244142 | A1 | 10/2011 | Cheng et al. |
| 2012/0153511 | A1 * | 6/2012 | Song ................ H01L 21/02118 257/786 |
| 2012/0181507 | A1 | 7/2012 | Dimitrakopoulos et al. |
| 2012/0193610 | A1 | 8/2012 | Kim |
| 2012/0245058 | A1 | 9/2012 | Monteiro et al. |
| 2013/0011630 | A1 | 1/2013 | Sullivan et al. |
| 2013/0105440 | A1 * | 5/2013 | Lu ........................ G03F 7/0047 216/41 |
| 2013/0119350 | A1 | 5/2013 | Dimitrakopoulos et al. |
| 2013/0133925 | A1 | 5/2013 | Kim et al. |
| 2013/0203198 | A1 * | 8/2013 | Min ..................... H01L 51/428 438/46 |
| 2013/0236715 | A1 | 9/2013 | Zhamu et al. |
| 2013/0313523 | A1 | 11/2013 | Yun et al. |
| 2014/0015000 | A1 * | 1/2014 | Nishiyama ............ C08J 5/18 257/100 |
| 2014/0098458 | A1 | 4/2014 | Almadhoun et al. |
| 2014/0183701 | A1 * | 7/2014 | Choi ................ H01L 21/02282 257/618 |
| 2014/0186777 | A1 * | 7/2014 | Lee ........................ C07C 33/26 430/325 |
| 2014/0187035 | A1 | 7/2014 | Posseme et al. |
| 2014/0239462 | A1 | 8/2014 | Shamma et al. |
| 2014/0299820 | A1 | 10/2014 | Harandek et al. |
| 2014/0299841 | A1 | 10/2014 | Nourbakhsh et al. |
| 2014/0320959 | A1 | 10/2014 | Jun et al. |
| 2014/0342273 | A1 * | 11/2014 | Kim ........................ G03F 7/094 430/5 |
| 2014/0346408 | A1 | 11/2014 | Yun et al. |
| 2015/0001178 | A1 * | 1/2015 | Song ..................... C07C 217/58 216/47 |
| 2015/0004531 | A1 * | 1/2015 | Choi ...................... G03F 7/094 430/5 |
| 2015/0008212 | A1 * | 1/2015 | Choi ...................... C07C 39/14 216/41 |
| 2015/0030968 | A1 | 1/2015 | Schwab et al. |
| 2015/0056394 | A1 | 2/2015 | Rawls |
| 2015/0064904 | A1 | 3/2015 | Yao et al. |
| 2015/0129809 | A1 | 5/2015 | Gauthy et al. |
| 2015/0137077 | A1 | 5/2015 | Yun et al. |
| 2015/0200090 | A1 | 7/2015 | Chada et al. |
| 2015/0200091 | A1 | 7/2015 | Chada et al. |
| 2015/0307730 | A1 | 10/2015 | Hersam et al. |
| 2015/0348794 | A1 * | 12/2015 | Kim ...................... H01L 21/324 438/703 |
| 2015/0376014 | A1 | 12/2015 | Cesareo et al. |
| 2015/0377824 | A1 | 12/2015 | Ruhl et al. |
| 2016/0005625 | A1 * | 1/2016 | Shin ....................... H01L 21/47 438/703 |
| 2016/0011511 | A1 | 1/2016 | Shin et al. |
| 2016/0027645 | A1 * | 1/2016 | Shin ..................... H01L 21/0332 438/703 |
| 2016/0043384 | A1 | 2/2016 | Zhamu et al. |
| 2016/0130151 | A1 | 5/2016 | Kurungot et al. |
| 2016/0152748 | A1 | 6/2016 | Goffredi et al. |
| 2016/0179005 | A1 | 6/2016 | Shamma et al. |
| 2016/0211142 | A1 | 7/2016 | Kim et al. |
| 2016/0225991 | A1 | 8/2016 | Schwab et al. |
| 2016/0240841 | A1 | 8/2016 | He et al. |
| 2016/0282721 | A1 * | 9/2016 | Seol ........................... G03F 7/11 |
| 2016/0284811 | A1 | 9/2016 | Yu et al. |
| 2016/0291472 | A1 * | 10/2016 | Shin ........................ G03F 7/094 |
| 2016/0346769 | A1 | 12/2016 | Kim et al. |
| 2016/0369149 | A1 | 12/2016 | Liu et al. |
| 2017/0040178 | A1 * | 2/2017 | Kim ...................... H01L 21/324 |

FOREIGN PATENT DOCUMENTS

| | | | |
|---|---|---|---|
| EP | 1703328 | * | 9/2006 |
| EP | 2950334 A1 | | 12/2015 |
| JP | 52-059792 | * | 5/1977 |
| JP | 05-163021 | * | 6/1993 |
| JP | H 5-343308 A | | 12/1993 |
| JP | 3396846 B2 | | 4/2003 |
| JP | 2005-173552 A | | 6/2005 |
| JP | 4488234 B2 | | 4/2010 |
| JP | 4531400 B2 | | 6/2010 |
| JP | 2013-185155 A | | 9/2013 |
| JP | 2013-208881 A | | 10/2013 |
| KR | 10-1057218 B1 | | 8/2011 |
| KR | 20110090368 A | | 8/2011 |
| KR | 10-2011-0138611 A | | 12/2011 |
| KR | 10-2012-0024756 A | | 3/2012 |
| KR | 10-1114131 B1 | | 3/2012 |
| KR | 20100139422 | | 7/2012 |
| KR | 101257694 B1 | | 4/2013 |
| KR | 10-2013-0062924 A | | 6/2013 |
| KR | 10-2013-0132103 A | | 12/2013 |
| KR | 101343014 B1 | | 12/2013 |
| KR | 2014-0066524 A | | 6/2014 |
| KR | 10-1423171 B1 | | 7/2014 |
| KR | 10-1439030 B1 | | 9/2014 |
| KR | 2016-0118782 A | | 10/2016 |

(56) References Cited

FOREIGN PATENT DOCUMENTS

| WO | WO-2012/129302 A2 | 9/2012 | |
|---|---|---|---|
| WO | 2013/100365 * | 7/2013 | ............... G03F 7/11 |
| WO | WO-2014/135455 A1 | 9/2014 | |

OTHER PUBLICATIONS

U.S. Office Action dated Mar. 28, 2016 issued in co-pending U.S. Appl. No. 14/697,150.
U.S. Office Action dated Mar. 22, 2016 issued in co-pending U.S. Appl. No. 14/725,390.
European Search Report dated Sep. 30, 2015 issued in European Application No. 15169702.6.
Zhang, et al. "Fabrication of highly oriented reduced graphene oxide microbelts array for massive production of sensitive ammonia gas sensors", Journal of MicroMechanics and MicroEngineering, vol. 23, pp. 1-8, (2013).
Huang, et al. "An innovative way of etching MoS2: Characterization and mechanistic investigation", Nano Research, vol. 6, No. 3, pp. 200-207, (2013).
Hwang, et al. "Transparent actuator made with few layer graphene electrode and dielectric elastomer, for variable focus lens", Applied Physics Letters, vol. 103, pp. 023106-1-023106-5, (2013).
Grenadier, et al. "Dry etching techniques for active devices based on hexagonal boron nitride epilayers," Journal of Vacuum Science & Technology A, vol. 31, pp. 061517-061517.3 (2013).
S. Hascik, et al. "Dry etching of carbon layers in various etch gases," Vacuum, vol. 58, pp. 434-439 (2000).
Albert S. Nazarov, et al. "Functionalization and dispersion of h-BN nanosheets treated with inorganic reagents," Chemistry, An Asian Journal, vol. 7, Issue 3, pp. 1-6, (2012).
U.S. Notice of Allowance dated Oct. 19, 2016 issued in co-pending U.S. Appl. No. 14/725,390.
U.S. Office Action dated Sep. 30, 2016 issued in co-pending U.S. Appl. No. 14/697,150.
U.S. Appl. No. 15/332,287, filed Oct. 24, 2016.
U.S. Notice of Allowance dated Mar. 15, 2017 issued in co-pending U.S. Appl. No. 14/697,150.
U.S. Office Action dated Oct. 6, 2017 issued in co-pending U.S. Appl. No. 14/843,003.
U.S. Office Action dated Dec. 5, 2017 issued in co-pending U.S. Appl. No. 15/611,935.
European Search Report dated Aug. 17, 2016 cited in corresponding European Application No. 15193939.4.
U.S. Office Action dated May 8, 2017 issued in co-pendinq U.S. Appl. No. 14/43,003.
Song, et al. "Highly Efficient Light-Emitting Diode of Graphene Quantum Dots Fabricated from Graphite Intercalation Compounds" Advanced Optical Materials, pp. 1-8 (2014).
Wang, et al. "Gram-scale synthesis of single-crystalline graphene quantum does with superior optical properties," Macmillian Publishers Limited, pp. 1-9 (2014).
Shin, et al. "Mass Production of Grahene Quantum Dots by One-Pot Synthesis Directly from Graphite in High Yield", Small-journal.com, vol. 10, No. 5, pp. 866-870 (2014).
U.S. Office Action dated Feb. 21, 2018 in U.S. Appl. No. 15/332,287.
U.S. Office Action dated Feb. 22, 2018 in U.S. Appl. No. 14/825,792.
U.S. Notice of Allowance dated Mar. 27, 2018, issued in co-pending U.S. Appl. No. 15/611,935.
U.S. Office Action dated May 22, 2018 issued in copending U.S. Appl. No. 14/843,003.
U.S. Notice of Allowance dated Jul. 16, 2018 issued in copending U.S. Appl. No. 14/825,792.
U.S. Notice of Allowance dated Jul. 20, 2018 issued in copending U.S. Appl. No. 15/611,935.
Final Office Action dated Nov. 23, 2018 for co-pending U.S. Appl. No. 14/843,003.
Prolongo, S.G. et al., "Graphene nanoplateets thickness and leteral size influence on the morphology and behavior of epoxy composites," European Polymer Journal 53 (2014), pp. 292-301.
Examination Report issued by the European Patent Office for EP Appl. No. 15 193 939.4 dated Oct. 29, 2018.

* cited by examiner

HARDMASK COMPOSITION AND METHOD OF FORMING PATTERN USING THE HARDMASK COMPOSITION

CROSS REFERENCE TO RELATED APPLICATION

This application claims the benefit of Korean Patent Application No. 10-2014-0083905, filed on Jul. 4, 2014, in the Korean Intellectual Property Office, the disclosure of which is incorporated herein in its entirety by reference.

BACKGROUND

1. Field

Example embodiments relate to a hardmask composition and a method of forming a pattern using the hardmask composition.

2. Description of the Related Art

The semiconductor industry has developed an ultra-fine technique for providing a pattern of several to several tens of nanometer size. Such an ultrafine technique benefits from effective lithographic techniques. A typical lithographic technique includes providing a material layer on a semiconductor substrate, coating a photoresist layer on the material layer, exposing and developing the same to provide a photoresist pattern, and etching the material layer using the photoresist pattern as a mask.

According to minimizing of the pattern to be formed, it may be difficult to provide a fine pattern having a desirable profile by only the typical lithographic technique described above. Accordingly, a layer, called "a hardmask", may be formed between the material layer for the etching and the photoresist layer to provide a fine pattern. The hardmask serves as an interlayer that transfers the fine pattern of the photoresist to the material layer through a selective etching process. Thus, the hardmask layer needs to have chemical resistance, thermal resistance, and etching resistance in order to tolerate various types of etching processes.

As semiconductor devices have become highly integrated, a height of a material layer is maintained the same or has relatively increased, although a line-width of the material layer has gradually narrowed. Thus, an aspect ratio of the material layer has increased. Since an etching process needs to be performed under such conditions, the heights of a photoresist layer and a hardmask pattern also need to be increased. However, increasing the heights of a photoresist layer and a hardmask pattern is limited. In addition, the hardmask pattern may be damaged during the etching process for obtaining a material layer with a narrow line-width, and thus electrical characteristics of devices may deteriorate.

In this regard, methods have been suggested to use a single layer or multiple layers, in which a plurality of layers are stacked, of a conductive or insulative material such as a polysilicon layer, a tungsten layer, and a nitride layer. However, the single layer or the multiple layers requires a high deposition temperature, and thus physical properties of the material layer may be modified. Therefore, a novel hardmask material is needed.

SUMMARY

Example embodiments provide a hardmask composition with improved etching resistance.

Example embodiments also provide a method of forming a pattern using the hardmask composition.

Additional aspects will be set forth in part in the description which follows and, in part, will be apparent from the description, or may be learned by practice of example embodiments.

According to example embodiments, a hardmask composition includes a first material including one of an aromatic ring-containing monomer and a polymer containing a repeating unit including an aromatic ring-containing monomer, a second material including at least one of a hexagonal boron nitride and a precursor thereof, a chalcogenide-based material and a precursor thereof, and a two-dimensional carbon nanostructure and a precursor thereof, the two-dimensional carbon nanostructure containing about 0.01 atom % to about 40 atom % of oxygen, and a solvent.

According to example embodiments, a method of forming a pattern includes forming a layer on a substrate, forming a hardmask by providing a hardmask composition on the layer, the hardmask composition including a first material including one of an aromatic ring-containing monomer and a polymer containing a repeating unit including an aromatic ring-containing monomer, a second material including at least one of a hexagonal boron nitride and a precursor thereof, a chalcogenide-based material and a precursor thereof, and a two-dimensional carbon nanostructure and a precursor thereof, the two-dimensional carbon nanostructure containing about 0.01 atom % to about 40 atom % of oxygen, and a solvent, forming a photoresist layer on the hardmask, forming a hardmask pattern on the layer by etching the hardmask using the photoresist layer as an etching mask, the hardmask pattern including a composite, the composite including the polymer containing the repeating unit including the aromatic ring-containing monomer, and the at least one of the hexagonal boron nitride, the chalcogenide-based material, and the two-dimensional carbon nanostructure connected to the polymer by a chemical bond, and etching the layer using the hardmask pattern as an etching mask.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
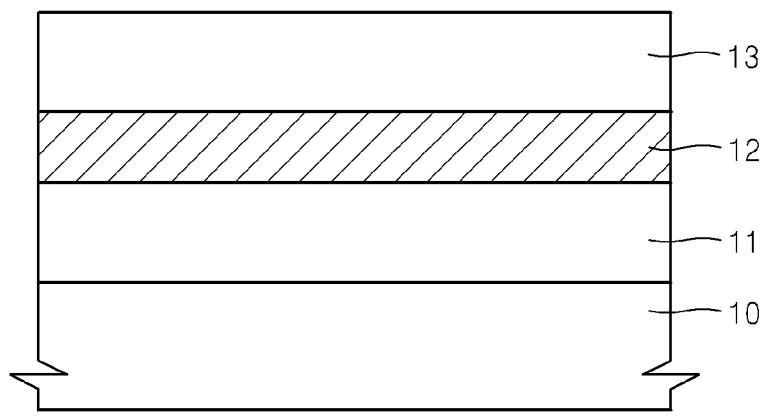
FIGS. 1A to 1E illustrate a method of forming a pattern using a hardmask composition according to example embodiments.

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of,"

when preceding a list of elements, modify the entire list of elements and do not modify the individual elements of the list.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a hardmask composition according to example embodiments and a method of forming a pattern using the hardmask composition will be described in detail.

According to example embodiments, a hardmask composition includes i) a first material including one of an aromatic ring-containing monomer and a polymer containing a repeating unit including an aromatic ring-containing monomer, ii) a second material including one of a hexagonal boron nitride, a chalcogenide-based material, a two-dimensional carbon nanostructure containing about 0.01 atom % to about 40 atom % of oxygen, and their precursors, and iii) a solvent.

The first material may be bound to the second material by a chemical bond. In this regard, the first material and the second material bound by a chemical bond have a complex structure.

The first material and the second material having the functional group described above may be connected by a chemical bond through a chemical reaction.

The chemical bond may be, for example, a covalent bond. Here, an example of the covalent bond may include at least one of an ester group (—C(=O)O—), an ether group (—O—), a thioether group (—S—), a carbonyl group (—C(=O)—), and an amide group (—C(=O)NH—).

The first material and the second material may include at least one of a hydroxyl group, a carboxyl group, an amino group, —Si($R_1$)($R_2$)($R_3$) (where, $R_1$, $R_2$, and $R_3$ are each independently a hydrogen atom, a hydroxyl group, a $C_1$-$C_{30}$ alkyl group, a $C_1$-$C_{30}$ alkoxy group, a $C_6$-$C_{30}$ aryl group, a $C_6$-$C_{30}$ aryloxy group, or a halogen atom), a thiol group (—SH), —Cl, —C(=O)Cl, —SCH$_3$, a glycidyloxy group, a halogen atom, an isocyanate group, an aldehyde group, an epoxy group, an imino group, an urethane group, an ester group, an amide group, an imide group, an acryl group, a methacryl group, a nitro group, —HSO$_3$, —(CH$_2$)$_n$COOH (where, n is an integer of 1 to 10), —CONH$_2$, a substituted or unsubstituted $C_1$-$C_{30}$ saturated organic group, and a substituted or unsubstituted $C_1$-$C_{30}$ unsaturated organic group.

In example embodiments, the $C_1$-$C_{30}$ saturated organic group and the $C_1$-$C_{30}$ unsaturated organic group may have a hydroxyl group, a carboxyl group, an amino group, —Si($R_1$)($R_2$)($R_3$) (where, each of $R_1$, $R_2$, and $R_3$ are independently one of a hydrogen atom, a hydroxyl group, a $C_1$-$C_{30}$ alkyl group, a $C_1$-$C_{30}$ alkoxy group, a $C_6$-$C_{30}$ aryl group, a $C_6$-$C_{30}$ aryloxy group, or a halogen atom), a thiol group (—SH), —Cl, —C(=O)Cl, —SCH$_3$, a glycidyloxy group, a halogen atom, an isocyanate group an aldehyde group, an epoxy group, an imino group, an urethane group, an ester group, an amide group, an imide group, an acryl group, a methacryl group, a nitro group, —HSO$_3$, —(CH$_2$)$_n$COOH (where, n is an integer of 1 to 10), —CONH$_2$, and a photosensitive functional group.

The aromatic ring-containing monomer is at least one of a monomer represented by Formula 1 and a monomer represented by Formula 2:

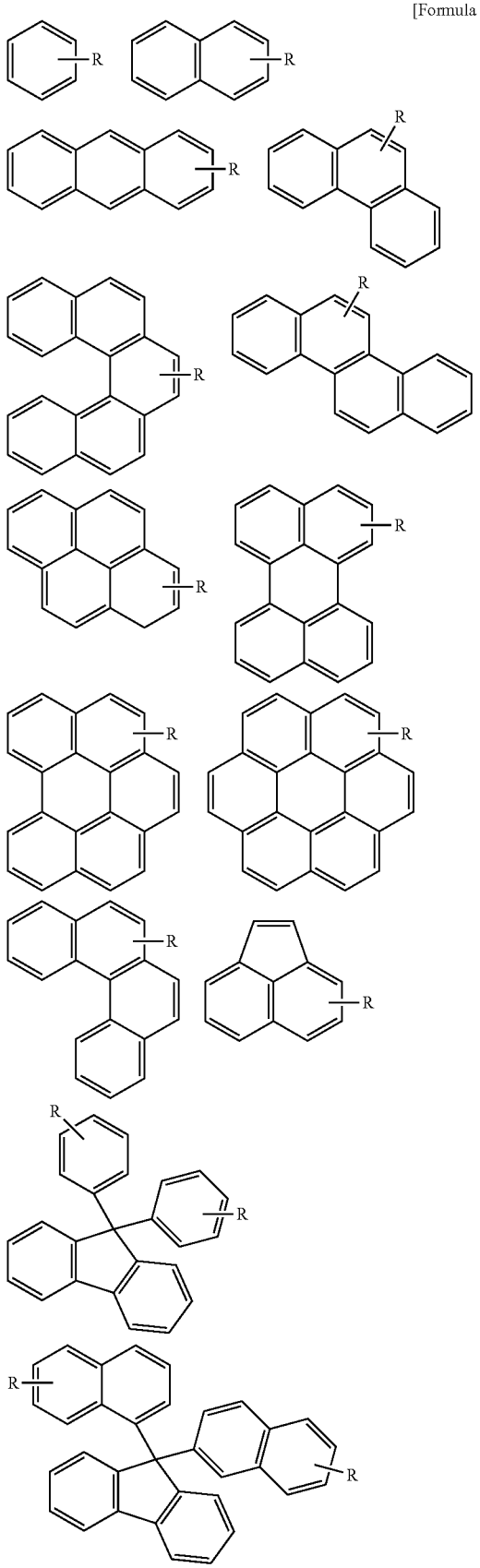

[Formula 1]

In Formula 1, R is a mono-substituted or a multi-substituted substituent that is at least one of a hydrogen atom, a halogen atom, a hydroxyl group, an isocyanate group, a glycidyloxy group, a carboxyl group, an aldehyde group, an amino group, a siloxane group, an epoxy group, an imino group, an urethane group, an ester group, an epoxy group, an amide group, an imide group, an acryl group, a methacryl group, a nitro group, —$HSO_3$, a substituted or unsubstituted $C_1$-$C_{30}$ saturated organic group, and a substituted or unsubstituted $C_1$-$C_{30}$ unsaturated organic group.

R may be a general photosensitive functional group as well as the groups listed above.

The $C_1$-$C_{30}$ saturated organic group and the $C_1$-$C_{30}$ unsaturated organic group may have a photosensitive functional group. Here, examples of the photosensitive functional group may be an epoxy group, an amide group, an imide group, an urethane group, and an aldehyde group.

Examples of the $C_1$-$C_{30}$ saturated organic group and the $C_1$-$C_{30}$ unsaturated organic group may be a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_4$-$C_{30}$ carbon-ring group, a substituted or unsubstituted $C_4$-$C_{30}$ carbon-ring oxy group, and a substituted or unsubstituted $C_2$-$C_{30}$ hetero-ring group.

In Formula 1, a binding site of R is not limited. Also, the number of R in Formula 1 is one for convenience of description, but R may be substituted to at any site where every substitution is possible.

A-L-A'  [Formula 2]

In Formula 2, each of A and A' are identical to or different from each other and are independently a monovalent organic group derived from one of the monomers represented by Formula 1; and L is a linker single bond including one of a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylenealkylene group, a substituted or unsubstituted $C_6$-$C_{30}$ arylene group, a substituted or unsubstituted $C_2$-$C_{30}$ heteroarylene group, a substituted or unsubstituted $C_2$-$C_{30}$ heteroarylenealkylene group, a substituted or unsubstituted $C_1$-$C_{30}$ alkyleneoxy group, a substituted or unsubstituted $C_7$-$C_{30}$ arylenealkyleneoxy group, a substituted or unsubstituted $C_6$-$C_{30}$ aryleneoxy group, a substituted or unsubstituted $C_2$-$C_{30}$ heteroaryleneoxy group, a substituted or unsubstituted $C_2$-$C_{30}$ heteroarylenealkyleneoxy group, —C(=O)—, and —$SO_2$—.

In L, the substituted $C_1$-$C_{30}$ alkylene group, substituted $C_2$-$C_{30}$ alkenylene group, substituted $C_2$-$C_{30}$ alkynylene group, substituted $C_7$-$C_{30}$ arylenealkylene group, substituted $C_6$-$C_{30}$ arylene group, substituted $C_2$-$C_{30}$ heteroarylene group, substituted $C_2$-$C_{30}$ heteroarylenealkylene group, substituted $C_1$-$C_{30}$ alkyleneoxy group, substituted $C_7$-$C_{30}$ arylenealkyleneoxy group, substituted $C_6$-$C_{30}$ aryleneoxy group, substituted $C_2$-$C_{30}$ heteroaryleneoxy group, and substituted $C_2$-$C_{30}$ heteroarylenealkyleneoxy group may be substituted with i) a photosensitive functional group or ii) at least one substituent including one of a halogen atom, a hydroxyl group, an isocyanate group, a glycidyloxy group, a carboxyl group, an aldehyde group, an amino group, a siloxane group, an epoxy group, an imino group, an urethane group, an ester group, an epoxy group, an amide group, an imide group, an acryl group, a methacryl group, a nitro group, and —HSO$_3$.

The first material is at least one of a compound represented by Formula 3 and a compound represented by Formula 4:

[Formula 3]

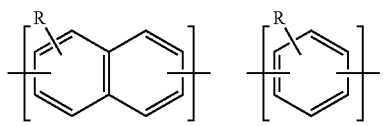

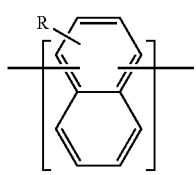

In Formula 3, R is as defined in the description of Formula 1.

[Formula 4]

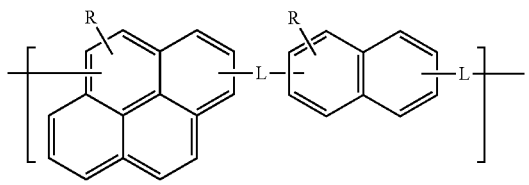

In Formula 4, R is as defined in the description of Formula 1; and

L is as defined in the description of Formula 2.

In Formulae 3 and 4 above, a binding site of R is not limited, and the number of R in Formulae 3 and 4 above is one for convenience of description, but R may be substituted to at any site where every substitution is possible.

A weight average molecular weight of the polymer containing a repeating unit including an aromatic ring-containing monomer is about 300 to about 30,000. When a polymer having a weight average molecular weight within this range is used, a thin film may be easily formed, and a transparent hardmask may be manufactured.

In example embodiments, the first material is a compound represented by Formula 5:

[Formula 5]

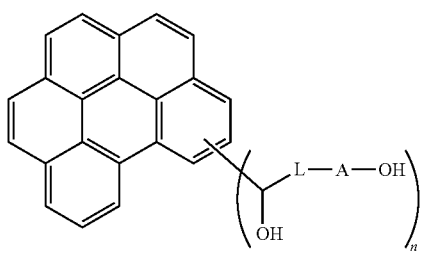

In Formula 5, A is a substituted or unsubstituted $C_6$ to $C_{30}$ arylene group;

L is a single bond or a substituted or unsubstituted $C_1$ to $C_6$ alkylene group; and n is an integer of 1 to 5.

The arylene group is one of the groups of Group 1:

[Group 1]

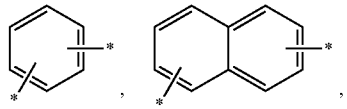

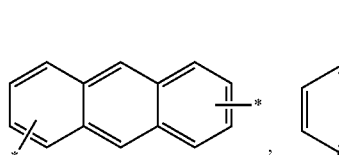

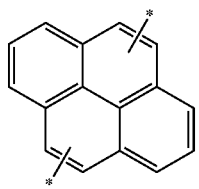

In example embodiments, the compound of Formula 5 may be represented by Formulae 6a to 6c:

[Formula 6a]

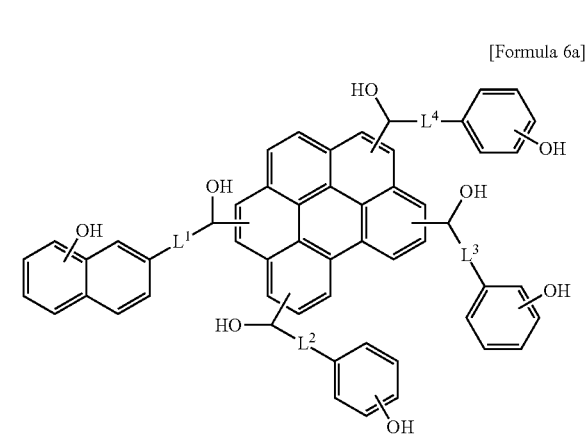

[Formula 6b]

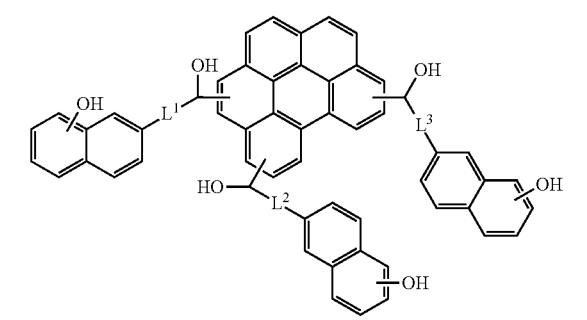

In Formula 6a, or 6b, each of $L^1$ to $L^4$ are independently one of a single bond and a substituted or unsubstituted $C_1$ to $C_6$ alkylene group.

The first material is one of the compounds represented by Formulae 6c to 6e:

[Formula 6c]

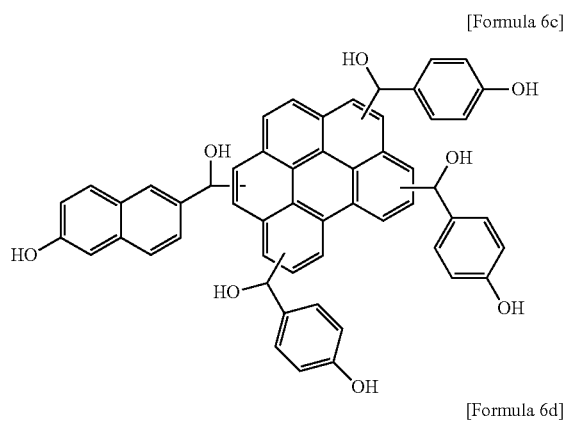

[Formula 6d]

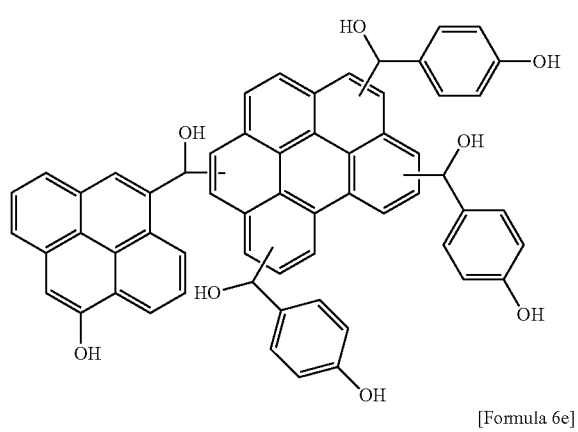

[Formula 6e]

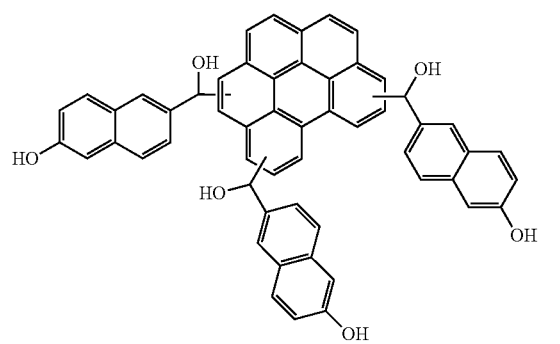

The first material may be a co-polymer represented by Formula 7:

[Formula 7]

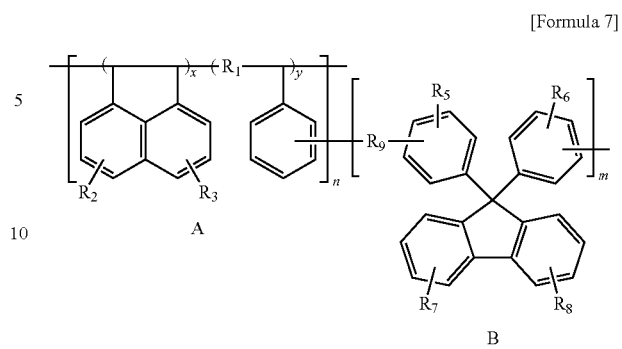

In Formula 7, $R_1$ is a $C_1$-$C_{10}$ substituted or unsubstituted alkylene group; each of $R_2$, $R_3$, $R_7$, and $R_8$ are independently one of a hydrogen atom, a hydroxyl group, a $C_1$-$C_{10}$ linear or branched alkyl group, a $C_4$-$C_{10}$ cycloalkyl group, a $C_1$-$C_{10}$ alkoxy group, and a $C_6$-$C_{30}$ aryl group; each of $R_4$, $R_5$, and $R_6$ are independently one of a hydrogen atom, a hydroxyl group, a $C_1$-$C_{10}$ alkylether group, and a $C_8$-$C_{20}$ phenyldialkylene ether group; $R_9$ is one of an $C_1$-$C_{10}$ alkylene group, a $C_8$-$C_{20}$ phenyldialkylene group, and a $C_7$-$C_{20}$ hydroxyphenylalkylene group; each of x and y are independently a mole fraction of two repeating units in part A which is about 0 to about 1, where x+y=1; n is an integer of 1 to 200; and m is an integer of 1 to 200.

The first material is a polymer represented by Formula 7a, Formula 7b, or Formula 7c:

[Formula 7a]

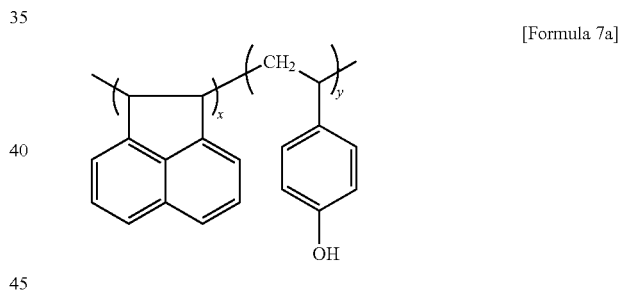

In Formula 7a, x is 0.2, and y is 0.8.

[Formula 7b]

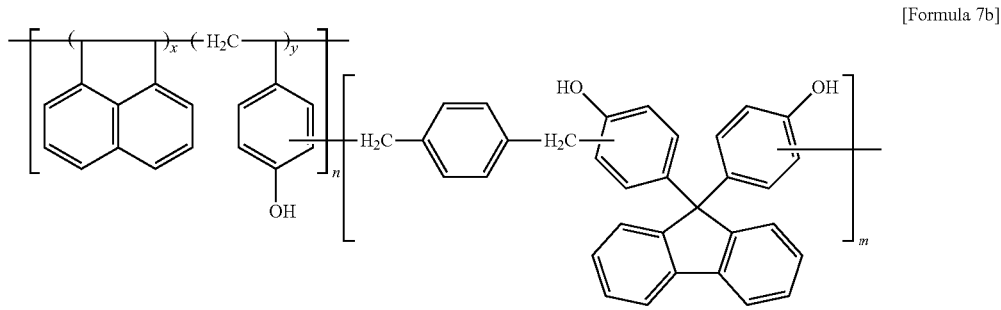

In Formula 7b, x is 0.2, y is 0.8, n=90, and m=10.

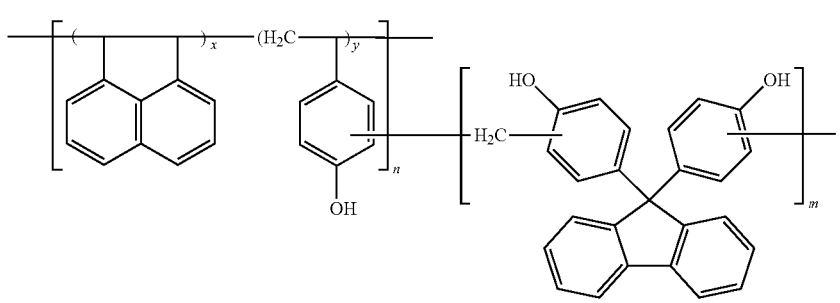

[Formula 7c]

In Formula 7c, x is 0.2, y is 0.8, n=90, and m=10.

The first material may be a copolymer represented by Formula 8 or Formula 9:

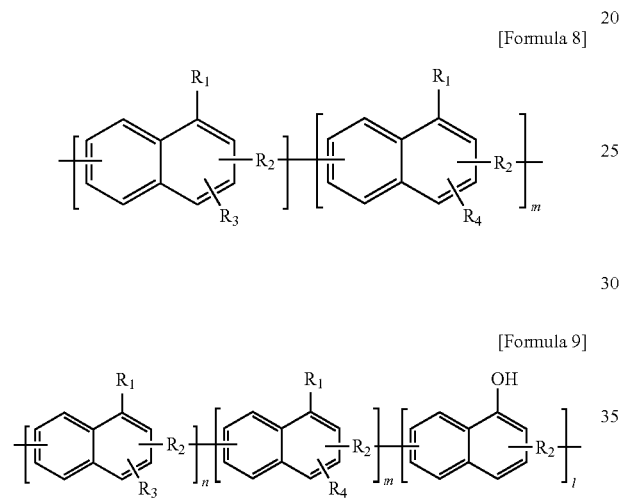

[Formula 8]

[Formula 9]

In Formulae 8 and 9, m, n and l are each independently an integer of 1 to 190; $R_1$ is one of a hydrogen (—H), a hydroxyl group (—OH), a C1-C10 alkyl group, a C6-C10 aryl group, allyl group, and a halogen atom; $R_2$ is one of a group represented by Formula 9A, a phenyl, a chrysene, a pyrene, a fluoroanthene, an anthrone, a benzophenone, a thioxanthone, an anthracene, and their derivatives; $R_3$ is a conjugated diene; and $R_4$ is an unsaturated dienophile.

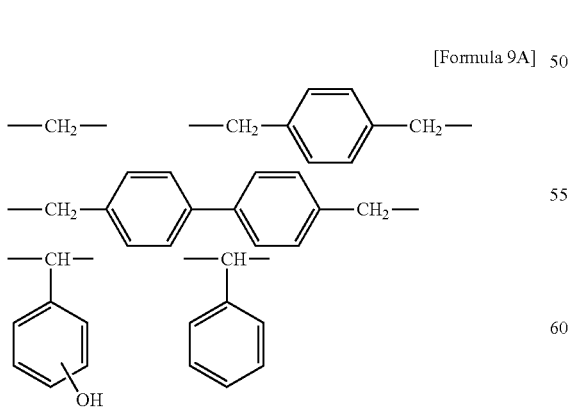

[Formula 9A]

In Formula 9A, $R_3$ is 1,3-butadienyl group or a 1,6-cyclopentadienylmethyl, and $R_4$ is a vinyl group or a cyclopentenylmethyl group.

In example embodiments, the copolymer may be a polymer represented by one of Formulae 10 to 12:

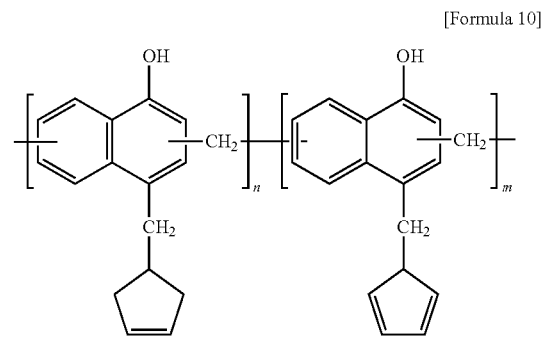

[Formula 10]

In Formula 10, m and n are each independently an integer of 1 to 190, for example, m+n=21, A The weight average molecular weight (Mw) of the polymer is about 10,000, and a polydispersity of the polymer is about 2.1.

[Formula 11]

In Formula 11, m and n are each independently an integer of 1 to 190, for example, m+n=21, The weight average molecular weight of the polymer is about 11,000, and a polydispersity of the polymer is about 2.1.

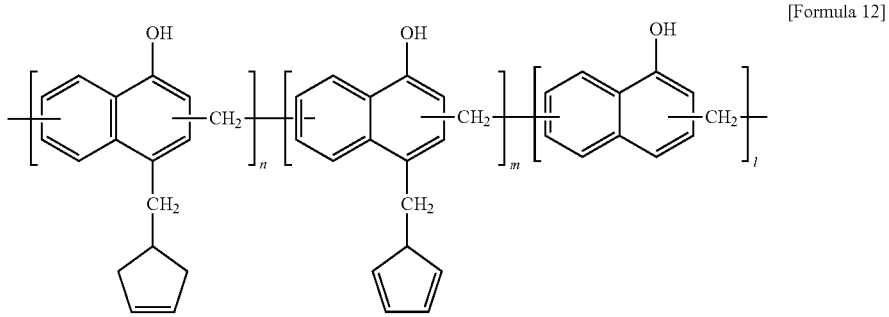

[Formula 12]

In Formula 12, m, n and 1 are each independently an integer of 1 to 190, for example, l+m+n=21; and n+m:l=2:1.

The weight average molecular weight of the copolymer is about 10,000; a polydispersity of the polymer is about 1.9.

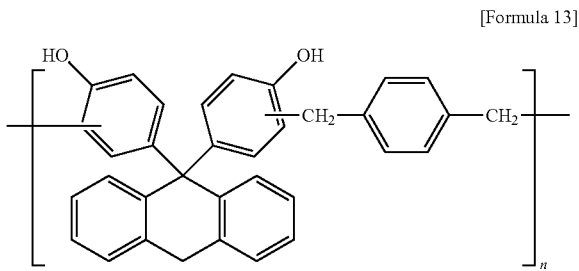

[Formula 13]

In Formula 13, n is an integer of 1 to 190, for example, n is an integer of about 20, The molecular average molecular weight (Mw) of the polymer is about 10,000; a polydispersity of the polymer is 2.0.

In the hardmask composition according to example embodiments, an example of the second material may be at least one of a hexagonal boron nitride and its precursor, a chalcogenide-based material and its precursor, and a two-dimensional carbon nanostructure containing about 0.01 atom % to about 40 atom % of oxygen and its precursor.

The chalcogenide-based material is a compound including at least one of Group 16 (chalcogenide) elements and one or more electropositive elements. For example, the chalcogenide-based material includes one or more metal elements including one of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb) and one chalcogenide element including one of sulfur (S), selenium (Se), and tellurium (Te).

The chalcogenide-based material is one of molybdenum sulfide ($MoS_2$), tungsten sulfide ($WS_2$), molybdenum selenide ($MoSe_2$), molybdenum telluride ($MoTe_2$), tungsten selenide ($WSe_2$), and tungsten telluride ($WTe_2$). In example embodiments, the chalcogenide-based material may be molybdenum sulfide ($MoS_2$).

The metal chalcogenide-based material has a structure including two chalcogenide atomic layers one of which is disposed above and the other below a metal atom as a unit structure and thus has semiconductor characteristics.

The chalcogenide-based material may be obtained using a vapor deposition method or ultrasonic waves.

The vapor deposition method may be performed by sputtering a chalcogenide-based source or by annealing process through heat-treatment while providing sulfur to a metal oxide. Here, an example of the metal oxide may be a molybdenum oxide or a tungsten oxide, and an example of the chalcogenide-based material may be a molybdenum sulfide or a tungsten sulfide. Alternatively, the vapor deposition method may be performed by annealing process through heat-treatment while providing sulfur to a precursor, such as $(NH_4)_2MoS_4$.

In example embodiments, the annealing process may be performed at a temperature in a range of about 300° C. to about 2,000° C. Then, a further annealing process may be performed through additional heat-treatment.

According to the method using ultrasonic waves, the chalcogenide-based material is obtained by performing an intercalation process of an alkali metal on a bulk plate source; preparing a layered structure, in which nanolevel-thin metal chalcogenide sheets are stacked in layers, using an ultrasound method; separating or detaching the layered structure to form a single layer or multiple layers of a metal chalcogenide solution. Here, a dispersant may be used to increase a concentration of the metal chalcogenide solution.

For example, a thickness of the metal chalcogenide sheet according to example embodiments may be in a range of about 0.67 nm to about 200 nm. The hexagonal boron nitride may have a layered structure including one layer to three hundred layers, for example, one layer to 10 layers. For example, the hexagonal boron nitride may be stable in a single layer.

The hexagonal boron nitride has a flat hexagonal crystal structure, the vertices of which are occupied alternatively by boron and nitrogen atoms. A layered structure of the hexagonal boron nitride is a structure in which a boron atom and a nitrogen atom neighboring each other are overlapped due to their polarities, where the structure is also referred to as "an AB stacking". Here, the hexagonal boron nitride may have a layered structure, in which nanolevel-thin sheets are stacked in layers, and the layered structure may be separated or detached to form a single layer or multiple layers of a hexagonal boron nitride sheet.

The hexagonal boron nitride is inactive in an oxidation atmosphere, and the separated or exfoliated hexagonal boron nitride sheet has improved thermal characteristics and electric insulation properties.

A method of forming a hexagonal boron nitride in a form of a thin sheet may include performing a chemical vapor deposition method on a metal surface or a method using ultrasonic waves.

When the chemical vapor deposition method performed on a metal surface is used, a two-dimensional hexagonal boron nitride nanostructure may be formed on the metal surface and may be formed at a desired location using a transfer method.

When the method using ultrasonic waves is used, multiple layers of the hexagonal boron nitride are obtained by dispersing a hexagonal boron nitride single crystal in an organic solvent, such as 1,2-dichloroethane, N-methylpyrrolidone, or isopropylalcohol, and treating the multiple layers with ultrasonic waves. A dispersant may be used to disperse a hexagonal boron nitride single crystal in an organic solvent.

As used herein, the term "hexagonal boron nitride" denotes a compound of an arbitrary solid form or crystallite size. A typical form of the hexagonal boron nitride includes a powder or a single crystal but is not limited thereto. A typical crystallite size of the hexagonal boron nitride is several nanometers to several tens of micrometers, and when the hexagonal boron nitride is a single crystal, the crystallite size of the hexagonal boron nitride is up to several millimeters.

The commercially available hexagonal boron nitride powder may be purchased and used as it is. Alternatively, the hexagonal boron nitride powder may be prepared by performing mechanical pulverization by directly milling the hexagonal boron nitride in a ball mill or treating the hexagonal boron nitride with ultrasonic waves in a solvent. Also, at least one organic functional group including one of a hydroxyl group, an amino group, an amide group, a carboxyl group, a sulfonic acid, $-HSO_3$, a nitro group ($-NO_2$), $-CH_2COOH$, and $-CHNH_2$ may be added to the hexagonal boron nitride. Here, a method of adding the organic functional group to the hexagonal boron nitride may be performed in almost the same manner as used in the method of adding a functional group to the two-dimensional carbon nanostructure. For example, introducing a functional group to the hexagonal boron nitride may be performed by supplying a raw material gas, which provides a functional group, to a bulk hexagonal boron nitride contained in a reactor, e.g., an autoclave. Here, a temperature of the reactor may be, for example, in a range of about 80° C. to about 300° C., and the raw material gas may be at least one of $H_2O_2$, $NH_3$, $N_2H_4$, oleum, and a mixture of sulfuric acid and nitric acid. An amount of introducing the raw material gas to the hexagonal boron nitride may be about 1 part by weight to 100 parts by weight based on 1 part by weight of the hexagonal boron nitride.

A thickness of the hexagonal boron nitride sheet according to example embodiments may be, for example, in a range of about 0.34 nm to about 100 nm. The hexagonal boron nitride may have a layered structure including one layer to three hundred layers, for example, one layer to 10 layers. For example, in general, the hexagonal boron nitride may be stable in a single layer.

In the hardmask composition according to example embodiments, a two-dimensional material that may form a chemical bond with the polymer including an aromatic ring-containing monomer includes at least one of a two-dimensional carbon nanostructure containing about 0.01 atom % to about 40 atom % of oxygen and a precursor of the two-dimensional carbon nanostructure.

As used herein, the term "two-dimensional carbon nanostructure" refers to a sheet structure of a single atomic layer formed by a carbon structure that forms polycyclic aromatic molecules in which a plurality of carbon atoms are covalently bound to one another and aligned into a planar shape, a network structure in which a plurality of carbon structures each having a plate shape of a small piece of film are interconnected and aligned into a planar shape, or a combination thereof. The covalently bound carbon atoms form repeating units that comprise 6-membered rings but may also form 5-membered rings and/or 7-membered rings. The carbon structure may be formed by stacking a plurality of layers including several sheet structures and/or network structures, and an average thickness of the carbon structure may be about 100 nm or less, for example, about 10 nm or less, or in a range of about 0.01 nm to about 10 nm.

The two-dimensional carbon nanostructure according to example embodiments may include oxygen atoms in addition to carbon atoms rather than being a complete C=C/C—C conjugated structure. Also, the two-dimensional carbon nanostructure may have a carboxyl group, a hydroxyl group, an epoxy group, or a carbonyl group at its end. Also, the two-dimensional carbon nanostructure and its precursor may include at least one functional group including one of a hydroxyl group, a carboxyl group, an amino group, —Si$(R_1)(R_2)(R_3)$ (where, each of $R_1$, $R_2$, and $R_3$ are independently one of a hydrogen atom, a hydroxyl group, a $C_1$-$C_{30}$ alkyl group, a $C_1$-$C_{30}$ alkoxy group, a $C_6$-$C_{30}$ aryl group, a $C_6$-$C_{30}$ aryloxy group, or a halogen atom), a thiol group (—SH), —Cl, —C(=O)Cl, —SCH$_3$, a glycidyloxy group, a halogen atom, —(CH$_2$)$_n$COOH (where, n is an integer of 1 to 10), —CONH$_2$, an isocyanate group, an aldehyde group, an epoxy group, an imino group, an urethane group, an ester group, an amide group, an imide group, an acryl group, a methacryl group, a nitro group, —HSO$_3$, a $C_1$-$C_{30}$ saturated organic group having a photosensitive functional group, and a $C_1$-$C_{30}$ unsaturated organic group having a photosensitive functional group in order to be bonded with the first material through a chemical bond.

In example embodiments, examples of a method of introducing the functional group to the two-dimensional carbon nanostructure and its precursor may include an oxidation process using at least one of a strong acid and an oxidizing agent, an electrochemical modification method, and a surface modification reaction using a modifier.

The strong acid may be at least one of nitric acid and sulfuric acid, and the oxidizing agent may be one of $H_2O_2$, KMnO$_4$, and KClO$_4$. For example, the oxidation process may be performed by treating the reactants with ultrasonic waves via a stirring process at room temperature.

Examples of the modifier may include potassium hydroxide, alkylchloride, H$_2$S, ammonia, chlorine (Cl$_2$), COCl$_2$ (solid), CO (gas), and CH$_3$SH (gas).

A general introduction method may be used as well as the method of introducing the functional group to the two-dimensional carbon nanostructure and its precursor. An oxygen content of the two-dimensional carbon nanostructure may be, for example, in a range of about 6 atom % to about 20 atom %, for example, about 10 atom % to about 15 atom %. In the two-dimensional carbon nanostructure, the oxygen content may be confirmed by, for example, an X-ray Photoelectron Spectroscopy (XPS) analysis.

When an oxygen content is less than 0.01 atom % in the two-dimensional carbon nanostructure, a bond with an aromatic ring compound may not be formed, and when an oxygen content is higher than 40 atom %, degassing may occur during an etching process.

The two-dimensional carbon nanostructure has an oxygen content within the ranges described above, and thus may have hydrophilic property so that a bonding strength to another layer may improve. Also, a dispersing property of the two-dimensional carbon nanostructure in a solvent may improve, and thus the hardmask composition may be easily prepared. In addition, due to the high bond-dissociation energy of a functional group including an oxygen atom, etching resistance to an etching gas may improve.

The two-dimensional carbon nanostructure according to example embodiments may have peaks observed at about 1340 cm$^{-1}$ to about 1350 cm$^{-1}$, about 1580 cm$^{-1}$, and about 2700 cm$^{-1}$ in Raman spectrum analysis. The peaks provide information of a thickness, a crystallinity, and a charge doping status of the two-dimensional carbon nanostructure. The peak observed at about 1580 cm$^{-1}$ is a "G mode" peak, which is generated by a vibration mode corresponding to stretching of a carbon-carbon bond. Energy of the "G mode" is determined by a density of excess charge doped in the two-dimensional carbon nanostructure. Also, the peak observed at about 2700 cm$^{-1}$ is a "2D mode" peak that is useful in the evaluation of a thickness of the two-dimensional carbon nanostructure. The peak observed at about 1340 cm$^{-1}$ to about 1350 cm$^{-1}$ was a "D mode" peak, which appears when an sp$^2$ crystal structure has defects and is mainly observed when many defects are found around edges of a sample or in the sample itself. Also, a ratio of a D peak intensity to a G peak intensity (an D/G intensity ratio) provides information of a degree of disorder of crystals of the two-dimensional carbon nanostructure.

An intensity ratio ($I_D/I_G$) of a D mode peak to a G mode peak obtained from Raman spectroscopy analysis of the two-dimensional carbon nanostructure is 2 or lower. For example, the intensity ratio ($I_D/I_G$) is within a range of about 0.001 to about 2.0. An intensity ratio ($I_D/I_G$) of a D mode peak to a G mode peak obtained from Raman spectroscopy analysis of the two-dimensional carbon nanostructure precursor is 2 or lower. For example, the intensity ratio ($I_D/I_G$) is within a range of about 0.001 to about 2.0.

An intensity ratio ($I_{2D}/I_G$) of a 2D mode peak to a G mode peak obtained from Raman spectroscopy analysis of the two-dimensional carbon nanostructure is 0.01 or higher. For example, the intensity ratio ($I_{2D}/I_G$) is within a range of about 0.01 to about 1.0, or about 0.05 to about 0.5.

An intensity ratio ($I_{2D}/I_G$) of a 2D mode peak to a G mode peak obtained from Raman spectroscopy analysis of the two-dimensional carbon nanostructure precursor is 0.01 or higher. For example, the intensity ratio ($I_{2D}/I_G$) is within a range of about 0.01 to about 1.0, or about 0.05 to about 0.5.

When the intensity ratio of a D mode peak to a G mode peak and the intensity ratio of a 2D mode peak to a G mode peak are within the ranges above, the two-dimensional carbon nanostructure may have a high crystallinity and a small defect, and thus a bonding energy increases so that a hardmask prepared using the two-dimensional carbon nanostructure may have improved etching resistance.

X-ray diffraction analysis using CuKα is performed on the two-dimensional carbon nanostructure, and as the result of the X-ray analysis, the two-dimensional carbon nanostructure may include a two-dimensional layered structure having a (002) crystal face peak. The (002) crystal face peak is observed with a diffraction angle within a range of about 20° to about 27°.

A d-spacing of the two-dimensional carbon nanostructure obtained from the X-ray diffraction analysis is in a range of about 0.3 to about 0.7, for example, about 0.334 to about 0.478. In addition, an average particle diameter of the crystals obtained from the X-ray diffraction analysis is about 1 nm or greater, or for example, in a range of about 23.7 Å to about 43.9 Å. When the d-spacing is within is range, the hardmask composition may have improved etching resistance.

The two-dimensional carbon nanostructure is formed as a single layer of two-dimensional nanocrystalline carbon or it is formed by stacking multiple layers of two-dimensional nanocrystalline carbon.

The two-dimensional carbon nanostructure according to example embodiments has a higher content of sp$^2$ carbon than that of sp$^3$ carbon and a high content of oxygen compared to a conventional amorphous carbon layer. An sp$^2$ carbon bond (that is, a bond of an aromatic structure) has a higher bonding energy than that of an sp$^3$ carbon bond.

The sp$^3$ structure is a 3-dimensional bonding structure of diamond having a tetrahedral shape, and the sp$^2$ structure is a two-dimensional bonding structure of graphite in which a carbon to hydrogen ratio (a C/H ratio) increases and thus may secure resistance to dry etching.

In the two-dimensional carbon nanostructure, an sp$^2$ carbon fraction is equal to or a multiple of an sp$^3$ carbon fraction. For example, an sp$^2$ carbon fraction is a multiple of an sp$^3$ carbon fraction by about 1.0 to about 10, or by about 1.88 to 3.42.

An amount of the sp$^2$ carbon atom bonding structure is about 30 atom % or more, for example, about 39.7 atom % to about 62.5 atom %, in the C1s XPS analysis. Due to the mixing ratio, bond breakage of the two-dimensional carbon nanostructure may be difficult since carbon-carbon bond energy is high. Thus, when a hardmask composition including the two-dimensional carbon nanostructure is used, etching resistance characteristics during the etching process may improve. Also, a bond strength between the hardmask and adjacent layers may increase.

A hardmask obtained using conventional amorphous carbon mainly includes a sp$^2$-centered carbon atom binding structure and thus may have improved etching resistance and low transparency. Therefore, when the hardmasks are aligned, problems may occur, and particles may be generated during a deposition process, and thus a hardmask manufactured using a diamond-like carbon having a sp$^3$-carbon atom binding structure has been developed. However, the hardmask has low etching resistance and thus has a limit in process application.

The two-dimensional carbon nanostructure according to example embodiments has improved transparency and etching resistance.

The two-dimensional carbon nanostructure according to example embodiments has crystallinity in a C-axis (a vertical direction of the layer) and an average particle diameter of about 1 nm or higher as in the result of XRD analysis. An average particle diameter of the crystals may be, for example, in a range of about 1.0 Å to about 1000 Å, or about 23.7 Å to about 43.9 Å. When an average particle diameter of the crystals is within this range, the hardmask may have improved etching resistance.

In the hardmask composition, a content of the second material may be about 0.01 part to about 99.99 parts by weight, for example, about 0.01 part to about 40.00 parts by weight for a hardmask composition with respect to which a transparent property is emphasized, and, for example, about 60 parts to about 99.99 parts by weight for a hardmask composition having an improved etching resistant property, based on 100 parts by weight of the total weight of the first material and the second material. When a content of the second material is within these ranges, the hardmask composition may have an improved coating property and, film-forming property, and a hardmask formed using the hardmask composition may have an improved etching resistant property, improved bonding strength with respect to a neighboring layer, and improved film stability.

In the hardmask composition according to example embodiments, any solvent capable of dissolving or dispersing the first material and the second material may be used. For example, the solvent may be at least one of water, an alcohol-based solvent, and an organic solvent.

Examples of the alcohol-based solvent may include methanol, ethanol, and isopropanol, and examples of the organic solvent may include N,N-dimethylformamide, N-methylpyrrolidone, dichloroethane, dichlorobenzene, N,N-dimethylsulfoxide, xylene, aniline, propylene glycol, propylene glycol diacetate, methoxypropanediol, diethyleneglycol, gamma-butyrolactone, acetylacetone, cyclohexanone, propylene glycol monomethyl ether acetate, γ-butyrolactone, dichloroethane, O-dichlorobenzene, nitromethane, tetrahydrofuran, nitromethane, dimethyl sulfoxide, nitrobenzene, butyl nitrite, methylcellosolve, ethylcellosolve, diethylether, diethyleneglycolmethylether, diethyleneglycolethylether, dipropyleneglycolmethylether, toluene, xylene, hexane, methylethylketone, methylisoketone, hydroxymethylcellulose, and heptane.

An amount of the solvent may be about 100 parts to about 100,000 parts by Weight based on 100 parts by weight of the total weight of the first material and the second material. When an amount of the solvent is within this range, the hardmask composition may have an appropriate viscosity and thus may more easily form a layer.

The two-dimensional carbon nanostructure precursor may be, for example, i) expanded graphite obtained from exfoliated graphite or ii) an oxidation product of acid-treated graphite.

In the hardmask composition according to example embodiments, as described above, the first material may be bonded to the second material through a chemical bond. Examples of the chemical bond may be as follows:

i) The first material and the second material are bonded by an ester bond due to esterification of the first material, which is an aromatic ring-containing monomer having a carboxyl group, and the second material, which is a two-dimensional carbon nanostructure having a hydroxyl group.

ii) The first material and the second material are bonded by an amide bond due to reaction of the first material, which is an aromatic ring-containing monomer having a carboxyl group, and the second material, which is a two-dimensional carbon nanostructure having an amino group.

iii) The first material and the second material are bonded by a siloxane bond (—Si—O—) due to dehydration condensation of the first material, which is an aromatic ring-containing monomer having —Si(OCH$_3$)$_2$OH, and the second material, which is a two-dimensional carbon nanostructure having a hydroxyl group.

iv) The first material and the second material are bonded by a siloxane bond (—Si—O—) due to hydrolysis and dehydration condensation of the first material, which is an aromatic ring-containing monomer having —Si(CH$_3$)$_2$OH, and the second material, which is a two-dimensional carbon nanostructure having a hydroxyl group.

A hardmask prepared using the hardmask composition according to example embodiments is an anti-reflection layer within a deep UV (DUV) wavelength region, e.g., ArF (about 193 nm), and KrF (about 248 nm). The hardmask has a refractive index and absorbance within appropriate ranges, and thus a reflective property between a resist and a lower layer may be reduced. When a pattern is formed using the hardmask composition, the hardmask composition may have a high etching selection ratio and sufficient resistance to multi-etching and thus may provide an improved lithographic structure in terms of pattern profile or margins.

Hereinafter, a method of preparing a hardmask using the hardmask composition according to example embodiments will be described in detail.

The hardmask composition according to example embodiments includes i) a first material including one of an aromatic ring-containing monomer and a polymer containing a repeating unit including an aromatic ring-containing monomer; ii) a second material including one of a hexagonal boron nitride, a chalcogenide-based material, a two-dimensional carbon nanostructure containing about 0.01 atom % to about 40 atom % of oxygen, and their precursors; and iii) a solvent.

The hardmask composition is prepared by dissolving the first material in the solvent to prepare a first material containing mixture, and then mixing the first material containing mixture with a mixture in which the second material is dispersed or dissolved.

Examples of the solvent may include solvents, e.g., 1,2-dichlorobenzene, 1,2-dichloroethane, dimethylformamide, N-methylpyrrolidone, and ethanol, and water.

The dispersion may be easily performed by simply mixing with a mechanical stirrer.

A hardmask including a polymer containing a repeating unit including an aromatic ring-containing monomer and at least one of a hexagonal boron nitride, a chalcogenide-based material, a two-dimensional carbon nanostructure containing about 0.01 atom % to about 40 atom % of oxygen, and their precursors, where the at least one of a hexagonal boron nitride, a chalcogenide-based material, a two-dimensional carbon nanostructure containing about 0.01 atom % to about 40 atom % of oxygen, and their precursors is connected with the polymer by a chemical bond, is prepared by coating the hardmask composition including the first material, the second material, and the solvent on a top surface of a to-be-etched layer.

During or after the process of coating the to-be-etched layer with the hardmask composition, a heat-treating process may be performed. Conditions for the heat-treating process may vary depending on a material of the to-be-etched layer, but a temperature of the heat-treating process may be from room temperature (about 25° C.) to about 1500° C.

The heat-treating process is performed in an inert gas atmosphere or in vacuum.

A heating source of the heat-treating process may be induction heating, radiant heat, lasers, infrared rays, microwaves, plasma, ultraviolet rays, or surface plasmon heating.

The inert gas atmosphere may be prepared by mixing a nitrogen gas and/or an argon gas.

After the heat-treating process, the solvent may be removed. The resultant from which the solvent is removed may be baked at a temperature of about 100° C. to about 400° C., and then another heat-treating process may be performed on the baked resultant at a temperature of about 400° C. to about 1,000° C.

When the temperatures of the heat-treating process and the baking process are within these ranges above, the hardmasks with improved etching resistance may be prepared.

A temperature increasing rate in the heat-treating process and the baking process is about 1° C./min to about 1000° C./min. When a temperature increasing rate is within this range, the deposited layer may not be damaged due to a rapid temperature change, and thus a process efficiency may be improved.

When the hardmask composition includes the precursor of the two-dimensional carbon nanostructure containing about 0.01 atom % to about 40 atom % of oxygen, a hardmask may be prepared in a manner described as follows.

The two-dimensional carbon nanostructure precursor may be i) a two-dimensional carbon nanostructure having less than 0.01 atom % of oxygen or ii) an oxygen free two-dimensional carbon nanostructure.

The two-dimensional carbon nanostructure precursor according to example embodiments may be, for example, expanded graphite obtained from exfoliated graphite. When expanded graphite is used as the two-dimensional carbon nanostructure precursor, self agglomeration of carbon layers constituting the two-dimensional carbon nanostructure is suppressed, and thus the two-dimensional carbon nanostructure may be evenly dispersed in the hardmask composition without adding an additive such as a dispersing agent or a surfactant so that the hardmask thus prepared may have improved etching resistance, and a process for removing unnecessary hardmask patterns after forming a to-be-etched layer pattern may be easy, where a residue such as a carbon residue may not be produced in the process.

In example embodiments, a two-dimensional carbon nanostructure precursor may have a structure that is formed of carbon layers obtained by performing a liquid exfoliating process using a solvent on expanded graphite.

The carbon layers may include different number of layers, for example, one layer to three hundred layers. For example, the carbon layers may include one layer to sixty layers, one layer to fifteen layers, or one layer to ten layers.

A hardmask may be prepared by coating with the to-be-etched layer with the hardmask composition including the two-dimensional carbon nanostructure precursor and a solvent and then oxidizing or reducing the coated product.

A hardmask may be manufactured by coating the to-be-etched layer with the hardmask composition including the first material, the second material, which is a precursor of the two-dimensional carbon nanostructure, and the solvent; and oxidizing or reducing the coated resultant.

In example embodiments, before the oxidizing or reducing of the coated resultant, the coated resultant may be heat-treated for a reaction of the first material and the second material.

In example embodiments, a heat-treating process for a reaction between the first material and the second material may be further performed in addition to the oxidizing or reducing of the coated resultant.

When the two-dimensional carbon nanostructure precursor is a two-dimensional carbon nanostructure containing more than 40 atom % of oxygen, the to-be-etched layer may be coated with the hardmask composition, and then the coated resultant may be reduced to form a hardmask. The two-dimensional carbon nanostructure containing more than 40 atom % of oxygen may contain, for example, about 60 atom % to about 80 atom % of oxygen.

When the two-dimensional carbon nanostructure precursor contains less than 0.01 atom % of oxygen, the to-be-etched layer may be coated with the hardmask composition, and then the coated resultant may be oxidized to prepare a hardmask.

The reducing process may be performed by chemical reduction, heat-treatment reduction, or electrochemical reduction.

The chemical reduction is performed using a reducing agent. Also, the reduction caused by heat-treatment may be performed by heat-treatment at a temperature of about 100° C. to about 1500° C.

Non-limiting examples of the reducing agent may include at least one of hydrazine, sodium borohydride, dimethylhydrazine, sulfuric acid, hydrochloric acid, hydrogen iodide, hydrogen bromide, hydrogen sulfide, hydroquinone, hydrogen, and acetic acid.

The oxidizing process may be performed using at least one of an acid, an oxidizing agent, UV, ozone, IR, heat-treatment, and plasma.

Examples of the acid may include sulfuric acid, nitric acid, acetic acid, phosphoric acid, hydrofluoric acid, perchloric acid, trifluoroacetic acid, hydrochloric acid, m-chlorobenzoic acid, and a mixture thereof. Also, examples of the oxidizing agent may include potassium permanganate, potassium perchlorate, ammonium persulfate, and a mixture thereof.

Hereinafter, a process of preparing a hardmask using the two-dimensional carbon nanostructure precursor according to example embodiments or a two-dimensional carbon nanostructure obtained therefrom will be described in detail.

First, an interlayer insertion material may be intercalated into graphite to obtain exfoliated graphite; expanded graphite, which is a two-dimensional carbon nanostructure, may be obtained from the exfoliated graphite; and thus a composition including the two-dimensional carbon nanostructure precursor may be obtained. The first material is added to the composition.

The expanded graphite may be obtained in the process of applying ultrasonic waves or microwaves to the exfoliated graphite or milling the exfoliated graphite. Here, the process of milling the exfoliated graphite may be performed using a ball mill or a mono-planar mill.

Optionally, a liquid exfoliating process including dispersion in a solvent may be performed on the expanded graphite. When the liquid exfoliating process is performed on the expanded graphite, a two-dimensional carbon nanostructure precursor including one layer to several tens layers of carbon layer may be obtained.

The interlayer insertion material may be at least one of sulfuric acid, chromic acid, and ions, e.g., potassium or sodium or an ion-containing compound.

Examples of the solvent in the liquid exfoliating process may be 1,2-dichlorobenzene, 1,2-dichloroethane, dimethylformamide, N-methylpyrrolidone, ethanol, and water. Also, ultrasonic waves may be used for the dispersion in the liquid exfoliating process. For example, the dispersion process in the solvent may be performed for about 0.5 hour to about 30 hours.

In example embodiments, when the expanded graphite is obtained by applying ultrasonic waves to the exfoliated graphite, a frequency of the ultrasonic waves may be in a range of about 20 KHz to about 60 KHz.

In example embodiments, when the expanded graphite is obtained by applying microwaves to the exfoliated graphite, an output of the microwaves may be about 50 W to about 1500 W, and a frequency of the microwaves may be in a range of about 2.45 KHz to about 60 KHz. A period of time for applying the microwaves may vary depending on the frequency of the microwaves but may be, for example, about 10 minutes to about 30 minutes.

Examples of graphite used as a starting material may include natural graphite, kish graphite, synthetic graphite, expandable graphite or expanded graphite, and a mixture thereof.

The hardmask composition thus obtained may be used to form a two-dimensional carbon nanostructure layer, and then, according to a process of oxidizing the layer, a hardmask including a two-dimensional carbon nanostructure having an oxygen content of about 0.01 atom % to about 40 atom % may be obtained. The two-dimensional carbon nanostructure layer obtained in this manner may have no defect, and a hardmask including the two-dimensional carbon nanostructure layer may have improved etching resistance.

Second, the graphite may be acid-treated. For example, an acid or an oxidizing agent may be added to the graphite, heated to allow the reaction, and cooled to room temperature (about 25° C.) to obtain a mixture containing a two-dimensional carbon nanostructure precursor. An oxidizing agent is added to the precursor-containing mixture to perform an oxidizing process, and thus a two-dimensional carbon nanostructure having about 0.01 atom % to about 40 atom % of oxygen may be obtained.

The two-dimensional carbon nanostructure precursor may include less than about 0.01 atom % of oxygen or may not contain oxygen.

The oxidizing agent, a concentration of an acid solution, and a treating time in the oxidizing process may be adjusted to control the oxygen content.

Examples of the acid and the oxidizing agent are as described above. An amount of the oxidizing agent may be, for example, about 0.00001 part to about 30 parts by weight based on 100 parts by weight of the graphite.

Third, in the second preparation process, the two-dimensional carbon nanostructure precursor is oxidized to the maximum to obtain a composition containing a two-dimensional carbon nanostructure precursor having more than 40 atom % of oxygen, and a two-dimensional carbon nanostructure precursor layer is formed using the composition. For example, an oxygen content in the two-dimensional carbon nanostructure precursor may be about 50 atom % to about 60 atom %. The layer thus formed may be reduced, and thus a hardmask containing a two-dimensional carbon nanostructure containing about 0.01 atom % to about 40 atom % of oxygen may be prepared.

The oxidizing process in the preparation process may be performed using at least one of acid, an oxidizing agent, UV (ultraviolet), ozone, IR (infrared), heat-treatment, and plasma. Here, the acid and the oxidizing agent may be as described above.

Heat-treatment may be performed during or after the process of coating the to-be-etched layer with the hardmask composition. Here, a temperature of the heat-treatment differs depending on a purpose of the heat-treatment but may be, for example, in a range of about 100° C. to about 1500° C.

Hereinafter, in example embodiments, a method of forming a pattern using a hardmask composition will be described by referring to FIGS. 1A to 1E.

Referring to FIG. 1A, a to-be-etched layer 11 is formed on a substrate 10. A hardmask composition according to example embodiments is provided on the to-be-etched layer 11 to form a hardmask 12.

A process of providing the hardmask composition is performed by one method including one of spin coating, air spraying, electrospraying, dip coating, spray coating, doctor blade coating, and bar coating.

In example embodiments, the hardmask composition may be provided using a spin-on coating method. Here, the hardmask composition may coat the substrate 10 at a thickness of, for example, in a range of about 10 nm to about 10,000 nm, or, about 10 nm to about 1,000 nm, but the thickness of the hard composition is not limited thereto.

A substrate 10 is not particularly limited, and the substrate may be at least one including one of, for example, a Si substrate; a glass substrate; a GaN substrate; a silica substrate; a substrate including at least one of nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

A photoresist layer 13 is formed on the hardmask 12.

Figure 1B:
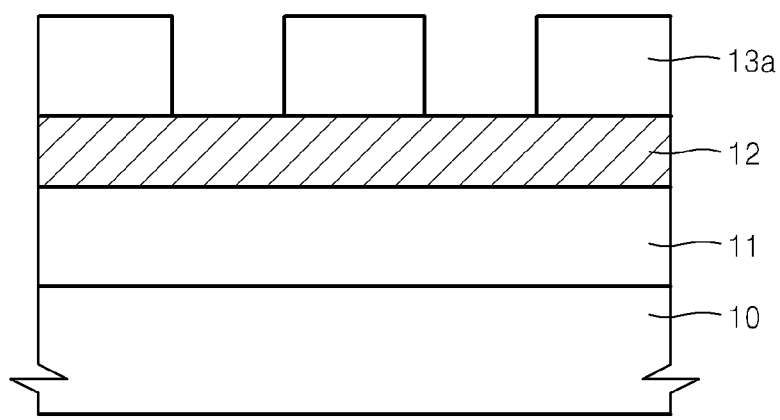

As shown in FIG. 1B, a photoresist pattern 13a is formed by exposing and developing the photoresist layer 13 using a common method in the art.

The process of exposing the photoresist layer 13 may be performed using, for example, ArF, KrF, or EUV. Also, after the exposing process, a heat-treating process at a temperature in a range of about 200° C. to about 500° C. may be performed on the exposed photoresist layer 13.

In the developing process, a developing solution such as an aqueous solution of tetramethylammonium hydroxide (TMAH) may be used.

Figure 1C:
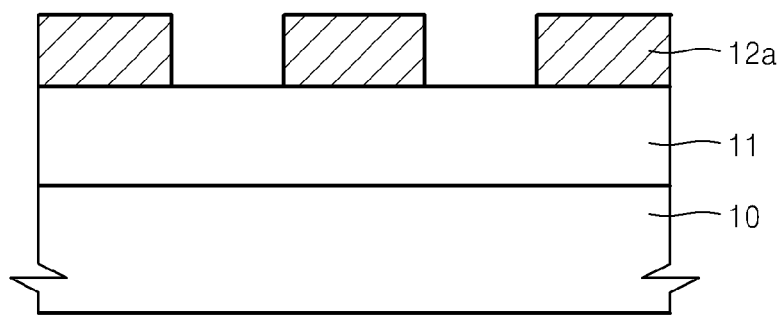

Thereafter, the hardmask 12 may be etched using the photoresist pattern 13a as an etching mask to form a hardmask pattern 12a on the to-be-etched layer 11 (FIG. 1C).

A thickness of the hardmask pattern 12a may be in a range of about 10 nm to about 10,000 nm. When the thickness of the hardmask pattern 12a is within this range, the layer may have improved etching resistance as well as improved homogenousness.

For example, the etching process may be performed using a dry etching method using an etching gas. Examples of the etching gas include at least one of $CF_4$, $CHF_3$, $SF_6$, $Cl_2$, $BCl_3$, and $O_2$.

In example embodiments, when a mixture gas of $C_4F_8$ and $CHF_3$ is used as the etching gas, a mixing ratio of $C_4F_8$ and $CHF_3$ may be in a range of about 1:10 to about 10:1 at a volume ratio.

The to-be-etched layer 11 may be formed as a plurality of patterns. The plurality of patterns may vary, for example, a metal pattern, a semiconductor pattern, and an insulator pattern. For example, the plurality of patterns may be various patterns applied to a semiconductor integrated circuit device.

The to-be-etched layer 11 may contain a material that is to be finally patterned. The material of the to-be-etched layer 11 may be, for example, a metal such as aluminum or copper, a semiconductor such as silicon, or an insulator such as silicon oxide or silicon nitride. The to-be-etched layer 11 may be formed using various methods such as sputtering, electronic beam deposition, chemical vapor deposition, and physical vapor deposition. For example, the to-be-etched layer 11 may be formed using a chemical vapor deposition method.

Figure 1D:
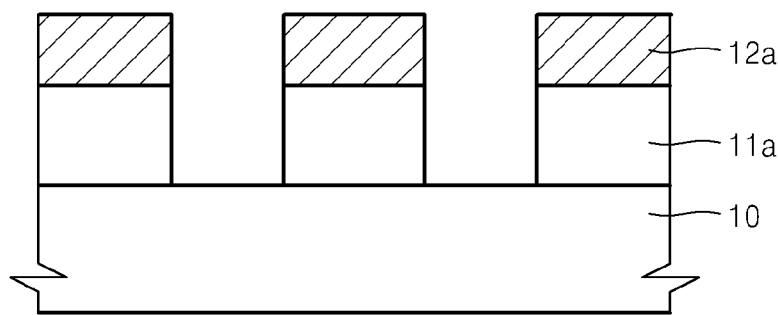
Figure 1E:
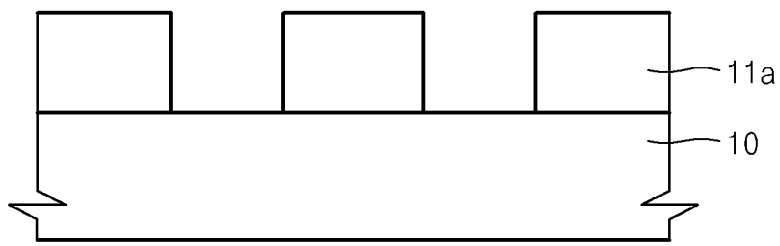

As shown in FIGS. 1D to 1E, the to-be-etched layer 11 may be etched using the hardmask pattern 12a as an etching mask to later form a to-be-etched layer pattern 11a having a desired fine pattern.

The hardmask according to example embodiments may be used as a stopper in the manufacture of a semiconductor device by being inserted between other layers.

Hereinafter, in example embodiments, a method of forming a pattern using a hardmask composition will be described by referring to FIGS. 2A to 2D.

Figure 2A:
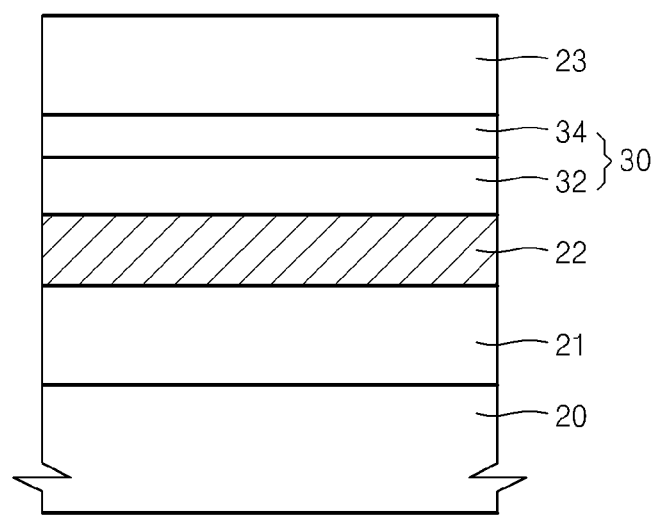
FIGS. 2A to 2D illustrate a method of forming a pattern using a hardmask composition according to example embodiments.

Referring to FIG. 2A, a to-be-etched layer 21 is formed on a substrate 20. The substrate 20 may be a silicon substrate.

The to-be-etched layer 21 may be formed as, for example, a silicon oxide layer, a silicon nitride layer, a silicon nitroxide layer, a silicon carbide (SiC) layer, or a derivative layer thereof.

Thereafter, a hardmask composition may be provided on the to-be-etched layer 21 to form a hardmask 22.

Figure 2B:
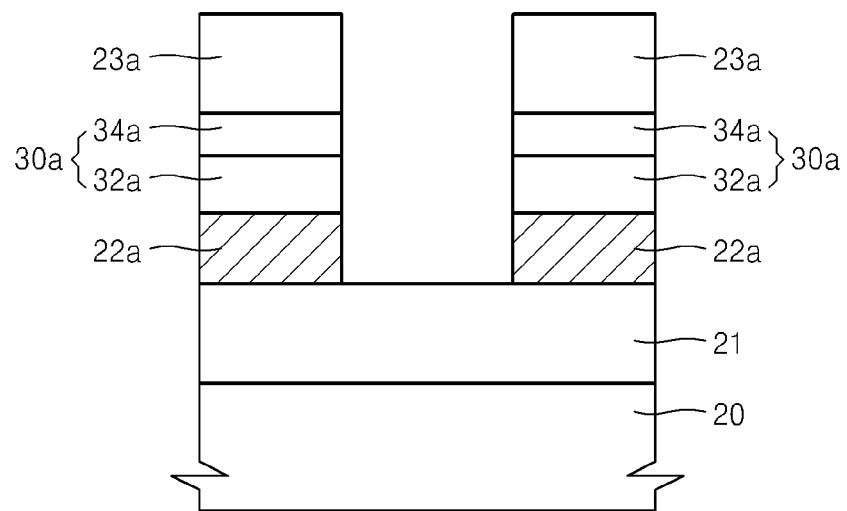
Figure 2C:
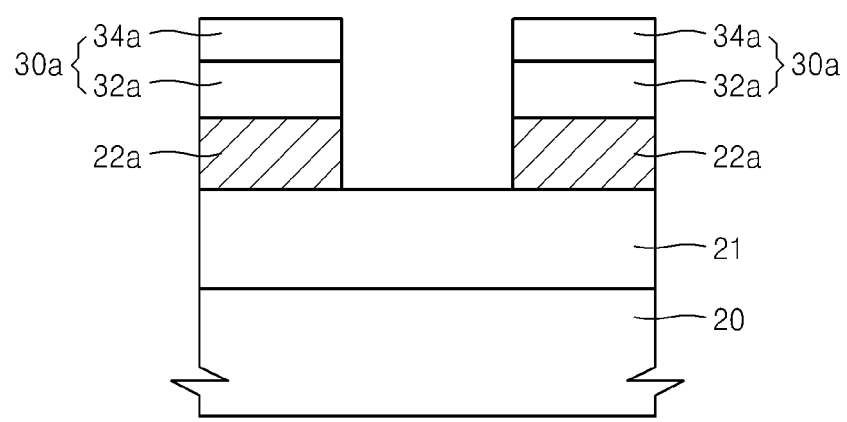

An anti-reflection layer 30 is formed on the hardmask 22. Here, the anti-reflection layer 30 may include an inorganic anti-reflection layer, an organic anti-reflection layer, or a combination thereof. FIGS. 2A to 2C illustrate cases where the anti-reflection layer 30 includes an inorganic anti-reflection layer 32 and an organic anti-reflection layer 34.

The inorganic anti-reflection layer 32 may be, for example, a SiON layer, and the organic anti-reflection layer 34 may be a polymer layer commonly used in the art having an appropriate refraction index and a high absorption coefficient on a photoresist with respect to a wavelength of light.

A thickness of the anti-reflection layer 30 may be, for example, in a range of about 100 nm to about 500 nm.

A photoresist layer 23 is formed on the anti-reflection layer 30.

The photoresist layer 23 is exposed and developed in a common manner to form a photoresist pattern 23a. Then, the anti-reflection layer 30 and the hardmask 22 are sequentially etched using the photoresist pattern 23a as an etching mask to form a hardmask pattern 22a on the to-be-etched layer 21. The reflection inhibition pattern 30a includes an inorganic reflection inhibition pattern 32a and an organic reflection inhibition pattern 34a.

FIG. 2B illustrates that the photoresist pattern 23a and a reflection inhibition pattern 30a remain after forming the hardmask pattern 22a. However, in example embodiments, a portion of or the whole photoresist pattern 23a and the reflection inhibition pattern 30a may be removed during the etching process for forming the hardmask pattern 22a.

FIG. 2C illustrates that only the photoresist pattern 23a is removed.

Figure 2D:
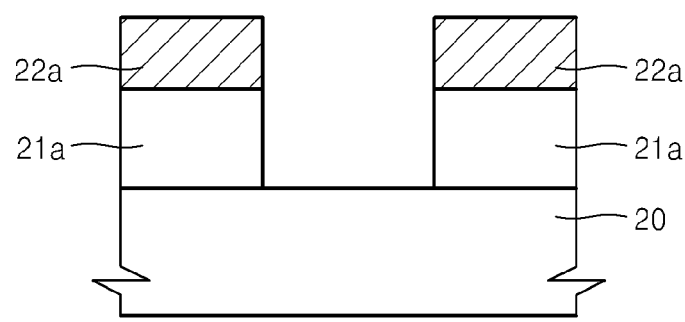

The to-be-etched layer 21 is etched using the hardmask pattern 22a as an etching mask to form a desired layer pattern, which is a to-be-etched layer pattern 21a (FIG. 2D).

As described above, the hardmask pattern 22a is removed after forming the to-be-etched layer pattern 21. In the preparation of the hardmask pattern according to example embodiments, the hardmask pattern 22a may be more easily removed using a common method in the art, and almost no residue remains after removing the hardmask pattern 22a.

The removing process of the hardmask pattern 22a may be performed by, but not limited to, $O_2$ ashing and wet stripping. For example, the wet stripping may be performed using alcohol, acetone, or a mixture of nitric acid and sulfuric acid.

The hardmask formed as described above includes a composite. The composite includes i) a polymer containing a repeating unit including an aromatic ring-containing monomer and ii) at least one of a hexagonal boron nitride, a chalcogenide-based material, and a two-dimensional carbon nanostructure containing about 0.01 atom % to about 40 atom % of oxygen, where the at least one of the hexagonal boron nitride, the chalcogenide-based material, and the two-dimensional carbon nanostructure is connected to the polymer by a chemical bond.

The two-dimensional material is a structure that is formed by stacking a two-dimensional nanocrystalline material in a direction of a z-axis. The two-dimensional material may have a thickness of about 100 nm or less and a length and a width in a range of about 500 nm to about 50 µm. Also, an aspect ratio (a ratio of the longest diameter to the shortest diameter) of the two-dimensional material, such as the two-dimensional carbon nanostructure, is at least 50.

The hardmask includes a two-dimensional carbon nanostructure containing about 0.01 atom % to about 40 atom % of oxygen, and the amount of $sp^2$ carbon structures is higher than the amount of $sp^3$ carbon structures in the hardmask. Thus, the hardmask may secure sufficient resistance to dry etching.

When the hardmask composition according to example embodiments is used, a transparent property of a thin layer may be maintained, and thus an additional align mask is not needed. When a monomer and a polymer are used, a coating property of the hardmask composition may be improved compared to that of a thin layer of inorganic flakes, and thus formation of a thin layer and thickness control may be simplified and a uniform thickness may be formed. Compared to a polymer or amorphous carbon of the related art, a hardmask having improved etching resistance and mechanical strength which may be easily removed after an etching process may be manufactured. When the hardmask is used, efficiency of a semiconductor process may be improved.

According to example embodiments, a pattern formed using a hardmask composition may be used in the manufacture and design of an integrated circuit device according to a preparation process of a semiconductor device. For example, the pattern may be used in the formation of a patterned material layer structure such as metal lining, holes for contact or bias, insulation sections (for example: a Damascene Trench (DT) or shallow trench isolation (STI)), or a trench for a capacitor structure.

Hereinafter are definitions of substituents used in the chemical formulae.

The term "alkyl" used in a chemical formula refers to a fully saturated branched or unbranched (or straight chain or linear) hydrocarbon group.

Examples of the "alkyl" include methyl, ethyl, n-propyl, isopropyl, n-butyl, isobutyl, sec-butyl, n-pentyl, isopentyl, neopentyl, iso-amyl, n-hexyl, 3-methylhexyl, 2,2-dimethylpentyl, 2,3-dimethyl pentyl, and n-heptyl.

At least one hydrogen atom in the "alkyl" may be substituted with a halogen atom, a $C_1$-$C_{20}$ alkyl group (e.g.: $CCF_3$, $CHCF_2$, $CH_2F$, or $CCl_3$) substituted with a halogen atom, a $C_1$-$C_{20}$ alkoxy group, a $C_2$-$C_{20}$ alkoxyalkyl group, a hydroxyl group, a nitro group, a cyano group, an amino group, an amidino group, a hydrazine group, a hydrazone group, a carboxylic acid or a salt thereof, a sulfonyl group, a sulfamoyl group, a sulfonic acid or a salt thereof, a phosphoric acid or a salt thereof, or a $C_1$-$C_{20}$ alkyl group, a $C_2$-$C_{20}$ alkenyl group, a $C_2$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, a $C_7$-$C_{20}$ heteroarylalkyl group, a $C_6$-$C_{20}$ heteroaryloxy group, a $C_6$-$C_{20}$ heteroaryloxyalkyl group, or a $C_6$-$C_{20}$ heteroarylalkyl group The term "halogen atom" includes fluorine, bromine, chlorine, and iodine.

The term "alkoxy" used in a chemical formula refers to alkyl-O—, and the alkyl group is as described above. Examples of the alkoxy include methoxy, ethoxy, propoxy, 2-propoxy, butoxy, tert-butoxy, pentyloxy, hexyloxy, cyclopropoxy, and cyclohexyloxy. In the alkoxy group, at least one hydrogen atom may be substituted with the same substituent groups as described above in connection with the alkyl group.

The term "alkenyl" used in a chemical formula refers to a branched or non-branched hydrocarbon having at least one carbon-carbon double bond. Examples of the alkenyl group include vinyl, allyl, butenyl, isopropenyl, and isobutenyl, and at least one hydrogen atom of the alkenyl group may be substituted with the same substituent groups as described above in connection with the alkyl group.

The term "alkynyl" used in a chemical formula refers to a branched or non-branched hydrocarbon having at least one carbon-carbon triple bond. Examples of the alkynyl group include ethynyl, butynyl, isobutynyl, and isopropynyl. At least one hydrogen atom of the alkynyl group may be substituted with the same substituent groups as described above in connection with the alkyl group.

The term "aryl" used in a chemical formula refers to an aromatic hydrocarbon that may be used alone or in a combination and includes at least one ring.

The term "aryl" includes a group, wherein aromatic rings are fused in one or more cycloalkyl rings.

Examples of the aryl may be phenyl, naphthyl, and tetrahydronaphthyl.

Also, at least one hydrogen atom in the aryl group may be substituted with the same substituent groups as described above in connection with the alkyl group.

The term "arylalkyl" used in a chemical formula refers to an alkyl group substituted with an aryl group. Examples of the arylakyl include benzyl and phenyl-$CH_2CH_2$—.

The term "aryloxy" used in a chemical formula refers to O-aryl, and examples of the aryloxy group include phenoxy. At least one hydrogen atom in the aryl group may be substituted with the same substituent groups as described above in connection with the alkyl group.

The term "heteroaryl" used in a chemical formula refers to a monocyclic or bicyclic organic compound including at least one heteroatom including one of N, O, P, and S, and the remaining ring atoms are C. For example, the heteroaryl group may include 1 to 5 heteroatoms and may include 5 to 10 ring members, wherein S or N may be oxidized to various oxidation states.

Examples of a monocyclic heteroaryl group include thienyl, puryl, pyrrolyl, imidazolyl, pyrazolyl, thiazolyl, isothiazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, isothiazol-3-yl, isothiazol-4-yl, isothiazol-5-yl, oxazol-2-yl, oxazol-4-yl, oxazol-5-yl, isooxazol-3-yl, isooxazol-4-yl, isooxazol-5-yl, 1,2,4-triazol-3-yl, 1,2,4-triazol-5-yl, 1,2,3-triazol-4-yl, 1,2,3-triazol-5-yl, tetrazolyl, pyrid-2-yl, pyrid-3-yl, 2-pyrazin-2-yl, pyrazin-4-yl, pyrazin-5-yl, 2-pyrimidin-2-yl, 4-pyrimidin-2-yl, or 5-pyrimidin-2-yl.

The term "heteroaryl" used in a chemical formula refers to a heteroaromatic ring that is fused in one or more of aryl, cyclyaliphatic, or heterocycle.

Examples of a bicyclic heteroaryl group include indolyl, isoindolyl, indazolyl, indolizinyl, purinyl, quinolizinyl, quinolinyl, and isoquinolinyl.

At least one hydrogen atom in the heteroaryl group may be substituted with the same substituent groups as described above in connection with the alkyl group.

The term "heteroarylalkyl" refers to an alkyl group substituted with heteroaryl.

The term "heteroaryloxy" refers to an O-heteroaryl moiety. At least one hydrogen atom in the heteroaryloxy group may be substituted with the same substituent groups as described above in connection with the alkyl group.

The term "heteroaryloxyalkyl" denotes an alkyl group substituted with heteroaryloxy. At least one hydrogen atom in the heteroaryloxyalkyl group may be substituted with the same substituent groups as described above in connection with the alkyl group.

The term "carbon ring" used in a chemical formula refers to a saturated or partially unsaturated non-aromatic monocyclic, bicyclic, or tricyclic hydrocarbon group.

Examples of the monocyclic hydrocarbon group include cyclopentyl, cyclopentenyl, cyclohexyl, and cyclohexenyl.

Examples of the bicyclic hydrocarbon group include bicyclo[2.1.1]hexyl.

Examples of the tricyclic hydrocarbon include adamantly.

At least one hydrogen atom in the "carbon ring" may be substituted with the same substituent groups as described above in connection with the alkyl group.

The term "a hetero-ring group" used in a chemical formula refers to a ring group composed of 5 to 10 atoms containing a heteroatom, such as nitrogen, sulfur, phosphor, or oxygen. In particular, an example of the hetero-ring group is pyridyl, and at least one hydrogen atom in the "hetero-ring group" may be substituted with the same substituent groups as described above in connection with the alkyl group.

The term "hetero-ring-oxy" refers to an O-hetero-ring, and at least one hydrogen atom in the "hetero-ring-oxy" group may be substituted with the same substituent groups as described above in connection with the alkyl group.

The term "sulfonyl" denotes R"—$SO_2$—, wherein, R" is a hydrogen atom, alkyl, aryl, heteroaryl, aryl-alkyl, heteroaryl-alkyl, alkoxy, aryloxy, cycloalkyl group, or a hetero-ring group.

The term "sulfamoyl" denotes $H_2NS(O_2)$—, alkyl-NHS($O_2$)—, (alkyl)$_2$NS($O_2$)-aryl-NHS($O_2$)—, alkyl-(aryl)-NS($O_2$)—, (aryl)$_2$NS(O)$_2$, heteroaryl-NHS($O_2$)—, (aryl-alkyl)-NHS($O_2$)—, or (heteroaryl-alkyl)-NHS($O_2$)—.

At least one hydrogen atom in the "sulfamoyl group" may be substituted with the same substituent groups as described above in connection with the alkyl group.

The term "amino group" includes a nitrogen atom that is covalently bonded to at least one carbon atom or heteroatom. The amino group includes —$NH_2$ and substituted moieties.

Also, examples of the amino group include an alkylamino group, in which a nitrogen atom is bonded to at least one additional alkyl group, and an aryl amino group or a diarylamino group, in which a nitrogen atom is bonded to at least one or two independently selected aryl groups.

The terms "alkylene", "alkenylene", "alkynylene", "arylene", and "heteroarylene" are, each respectively, as defined in "alkyl", "alkenyl", "alkynyl", "aryl", and "heteroaryl", except that monovalent groups of the "alkyl", "alkenyl", "alkynyl", "aryl", and "heteroaryl" are replaced with divalent groups.

A least one hydrogen atom in the "alkyl", "alkenyl", "alkynyl", "aryl", and "heteroaryl" may be substituted with the same substituent groups as described above in connection with the alkyl group.

Hereinafter, the present disclosure will be described in further detail with reference to the following examples. These examples are for illustrative purposes only and are not intended to limit the scope of the present inventive concepts.

Preparation Example 1: Preparation of Hexagonal Boron Nitride to which Hydroxyl (—OH) Functional Group is Bonded 100 mg of a bulk of a hexagonal boron nitride (h-BN) (available from Industrial Supply, Inc.) and 10 ml of a 30 wt % $H_2O_2$ solution were placed in an autoclave, and a temperature of the autoclave was increased to 100° C., and the mixture was allowed to react for about 12 hours or more. When the reaction was completed, the resultant was filtered, and thus a hexagonal boron nitride (h-BN), to which a hydroxyl group (—OH) was bonded, was obtained from the $H_2O_2$ solution.

Preparation Example 1a: Preparation of Hexagonal Boron Nitride to which Nitro Group ($NO_2$) and —$HSO_3$ Functional Group are Bonded A hexagonal boron nitride (h-BN), to which a nitro group ($NO_2$) and —$HSO_3$ functional group were bonded, was obtained in the same manner as in Preparation Example 1, except that 10 ml of a mixture of a nitric acid and a sulfuric acid at a weight ratio of 1:3 was used instead of 10 ml of the 30 wt % $H_2O_2$ solution.

Preparation Example 1b: Preparation of Hexagonal Boron Nitride to which —$HSO_3$ Functional Group is Bonded A hexagonal boron nitride (h-BN), to which —$HSO_3$ functional group was bonded, was obtained in the same manner as in Preparation Example 1, except that 10 ml of oleum was used instead of 10 ml of the 30 wt % $H_2O_2$ solution.

Preparation Example 2: Preparation of Hexagonal Boron Nitride to which —$NH_2$ Functional Group is Bonded 100 mg of h-BN and 10 ml of a hydrazine ($N_2H_4$) solution was placed in an autoclave, and a temperature was increased to 100° C., and the mixture was allowed to react for about 12 hours or more. When the reaction was completed, the resultant was filtered, and thus a hexagonal boron nitride (h-BN), to which —$NH_2$ was bonded, was obtained from the $N_2H_4$ solution.

Preparation Example 2a: Preparation of Hexagonal Boron Nitride to which $NH_2$ Functional Bonded 100 mg of h-BN was loaded in a microwave plasma chamber, 10 sccm of $NH_3$ was flowed thereto, 200 W of power was applied thereto, and then the resultant was treated at room temperature (about 25° C.) for 10 minutes. When the reaction was completed, a h-BN, to which —$NH_2$ was bonded, was obtained.

Preparation Example 3: Preparation of Hexagonal Boron Nitride to which —$(CH_2)_3COOH$ is Bonded 100 mg of h-BN was dispersed in THF in a flask, 100 ml of glutaric acid acyl peroxide (HOOC—$(CH_2)_3$—C=OO—OO=C—$(CH_2)_3$—COOH) was injected thereto, and the resultant was heated for 12 hours at a temperature of 80° C. During the reaction, $CO_2$ was removed, and the resultant was filtered to obtain a h-BN, to which —$(CH_2)_3COOH$ was bonded.

Preparation Example 4: Preparation of Hexagonal Boron Nitride to which —$CONH_2$ is Bonded 100 mg of the h-BN having —$(CH_2)COOH$ as prepared in Preparation Example 3 was added to a flask and then dispersed in THF. 1 ml of thionyl chloride ($SOCl_2$) was added thereto at a temperature of 0° C., the temperature was increased to room temperature (about 25° C.), and then the mixture was allowed to react for 2 hours. The resultant was filtered to obtain a h-BN, to which a —COCl functional group was bonded. Then, the h-BN thus obtained was dispersed again in THF, 10 ml of $NH_3$ gas was bubbled in the solution, the mixture was allowed to react at room temperature for 12 hours, and the resultant was filtered to obtain a h-BN, to which a $CONH_2$ functional group was bonded.

Preparation Example 5: Preparation of Two-Dimensional Carbon Structure 1 g of a graphite powder and 8.5 g of sodium chlorate ($NaClO_4$) were added to 20 ml of a fuming nitric acid ($HNO_3$) to prepare a mixture, and the mixture was stirred at room temperature (about 25° C.) for 24 hours. When the reaction was completed, the resultant was filtered to obtain a powder, and the powder was washed several times with deionized (DI) water. In this manner, a two-dimensional carbon nanostructure having an oxygen content of about 27.4% was obtained. The two-dimensional carbon nanostructure contained a functional group including oxygen, such as a hydroxyl group, an epoxy group, a carboxyl group, or a carbonyl group.

Preparation Example 6: Preparation of Two-Dimensional Carbon Structure

A two-dimensional carbon nanostructure having an oxygen content of about 21.0% was prepared in the same manner as in Preparation Example 5, except that a reaction time of the mixture at room temperature was changed from 24 hours to 60 minutes.

Preparation Example 7: Preparation of Two-Dimensional Carbon Structure

A two-dimensional carbon nanostructure having an oxygen content of about 13.3% was prepared in the same manner as in Preparation Example 5, except that a reaction time of the mixture at room temperature was changed from 24 hours to 5 minutes.

Preparation Example 8: Preparation of Molybdenum Sulfide to which a Hydroxyl Group is Bonded 1 g of a molybdenum sulfide powder (Sigma Aldrich) was added to 10 ml of NMP, and then 5 ml of butyllithium (n-BuLi) was injected thereto in a nitrogen atmosphere. The mixture was stirred at room temperature for 2 days, and then the reaction mixture was filtered to obtain a molybdenum sulfide powder.

100 mg of the molybdenum sulfide, powder and 10 ml of a 30 wt % $H_2O_2$ solution were placed in an autoclave, and a temperature of the autoclave was increased to 100° C., and the mixture was allowed to react for about 12 hours or more. When the reaction was completed, the resultant was filtered to prepare a molybdenum sulfide powder, to which a hydroxyl group was bonded.

Preparation Example 9: Preparation of Molybdenum Sulfide ($MoS_2$) to which a Hydroxyl Group is Bonded 100 mg of $(NH_4)_2MoS_4$ and 1 ml of mercapto ethanol (HS—$C_2H_4$—OH) were dissolved in 10 ml of dimethylformamide (DMF), and the solution was placed in an autoclave. A temperature in the autoclave was increased to about 200° C., and the solution was allowed to react for 12 hours or more. When the reaction was completed, the resultant was filtered, and thus $MoS_2$, to which a hydroxyl group is bonded, was obtained.

Preparation Example 10: Preparation of Tungsten Sulfide ($WS_2$) to which a Hydroxyl Group is Bonded Tungsten sulfide ($WS_2$), to which a hydroxyl group was bonded, was obtained in the same manner as in Preparation Example 8, except that 1 g of a tungsten sulfide powder was used instead of 1 g of a molybdenum sulfide powder.

Example 1

0.08 g of the two-dimensional carbon nanostructure prepared in Preparation Example 7 and 0.02 g of an aromatic ring-containing monomer represented by Formula 6e were dispersed in 10 ml of NMP to prepare a hardmask composition. While spray-coating a silicon substrate, on which a silicon oxide was formed, with the hardmask composition, the substrate was heat-treated at a temperature of 200° C. Subsequently, the resultant was baked at a temperature of 400° C. for 10 minutes, and thus a hardmask having a thickness of about 200 nm and containing a two-dimensional carbon nanostructure was prepared.

[Formula 6e]

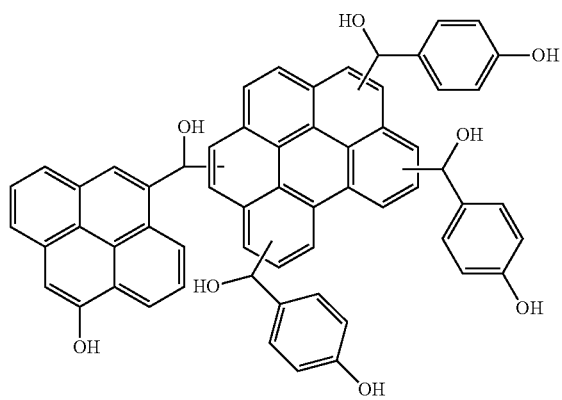

The hardmask was coated with an ArF photoresist at a thickness of about 1700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % tetramethyl ammonium hydroxide (TMAH) to form a photoresist pattern.

Dry etching was performed using the photoresist pattern, as a mask, and a $CF_4/CHF_3$ mixture gas. The etching conditions included 20 mT of a chamber pressure, 1800 W of a RT power, a 4/10 volume ratio of $C_4F_8/CHF_3$, and an etching time of about 120 seconds.

$O_2$ ashing and wet stripping were performed on a post hardmask and an organic material remaining after performing the dry etching to obtain a desired silicon substrate having a silicon oxide layer pattern as a final pattern.

Example 2

A silicon substrate having a silicon oxide layer pattern was prepared in the same manner as in Example 1, except that 0.05 g of the two-dimensional carbon nanostructure and 0.05 g of the aromatic ring-containing monomer of Formula 6e were used.

Example 3

A silicon substrate having a silicon oxide layer pattern was prepared in the same manner as in Example 1, except that 0.02 g of the two-dimensional carbon nanostructure and 0.08 g of the aromatic ring-containing monomer of Formula 6e were used.

Example 4

A silicon substrate having a silicon oxide layer pattern was prepared in the same manner as in Example 2, except that the hexagonal boron nitride prepared in Preparation Example 1 was used instead of the precursor of the two-dimensional carbon nanostructure.

Examples 5 and 6

A silicon substrate having a silicon oxide layer pattern was prepared in the same manner as in Example 2, except that molybdenum sulfides, which were chalcogenide-based materials prepared in Preparation Examples 8 and 9, were each used instead of the two-dimensional carbon nanostructure.

Comparative Example 1

A silicon substrate having a silicon oxide layer pattern was prepared using a hardmask including high-temperature amorphous carbon.

A carbon source ($C_3H_6$) was vapor-deposited on the silicon oxide layer formed on the silicon substrate to form a hardmask including high-temperature amorphous carbon.

The vapor deposition was performed using a chemical vapor deposition method under conditions including a temperature of about 550° C., a pressure in a range of about 0.01 mTorr to about 1 mTorr, and an ion energy in a range of about 50 eV to about 250 eV.

The hardmask was coated with an ArF photoresist at a thickness of about 1700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % TMAH to form a photoresist pattern.

Dry etching was performed using the photoresist pattern, as a mask, and a $CF_4/CHF_3$ mixture gas. The etching conditions included 20 mT of a chamber pressure, 1800 W of a RT power, a 4/10 volume ratio of $C_4F_8/CHF_3$, and an etching time of about 120 seconds.

$O_2$ ashing and wet stripping were performed on the hardmask and an organic material remaining after performing the dry etching to obtain a desired silicon substrate having a silicon oxide layer pattern as a final pattern.

Comparative Example 2

A silicon substrate having a silicon oxide layer pattern was prepared using a hardmask including low-temperature amorphous carbon in the same manner as in Comparative Example 1, except that a temperature of a deposition condition for the carbon source ($C_3H_6$) was changed to 300° C. to obtain low-temperature amorphous carbon.

Comparative Example 3

A monomer represented by Formula 6d was dissolved in a mixture solvent of propylene glycol monomethyl ether acetate (PGMEA), methylpyrrolidone, and gamma-butyrolactone (at a volume mixing ratio of 40:20:40), and the solution was filtered to prepare a hardmask composition.

[Formula 6d]

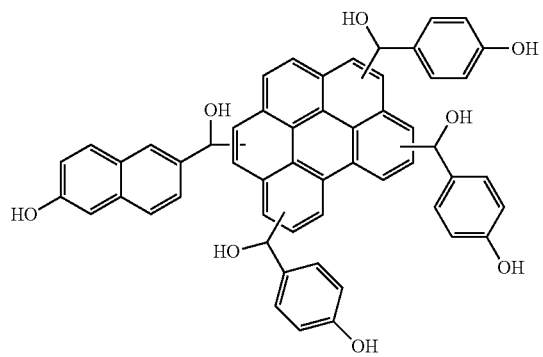

A silicon substrate having a silicon oxide layer pattern was coated with the hardmask composition obtained in the manner described above using a spin-on coating method, and then the resultant was heat-treated at a temperature of about 400° C. for about 120 seconds to form a hardmask including spin-on-carbon (SOC).

The hardmask was coated with an ArF photoresist at a thickness of about 1700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % TMAH to form a photoresist pattern.

Dry etching was performed using the photoresist pattern as a mask and a $CF_4/CHF_3$ mixture gas. The etching conditions included 20 mT of a chamber pressure, 1800 W of a RF power, a 4/10 volume ratio of $C_4F_8/CHF_3$, and an etching time of about 120 seconds.

$O_2$ ashing and wet stripping were performed on the hardmask and an organic material remaining after performing the dry etching to obtain a desired silicon substrate having a silicon oxide layer pattern as a final pattern.

Evaluation Example 1

X-Ray Diffraction (XRD) Analysis Measurement

1) Preparation Example 1

XRD analysis was performed on the functionalized hexagonal boron nitrides prepared in Preparation Example 1, Preparation Example 1a, Preparation Example 1b, and Preparation Example 2. For the XRD analysis, a 12 KW XRD diffractometer available from BRUKER AXS was used, and the analysis conditions included measurement at a rate of about 4° per minute within a range of about 5° to about 80°.

Figure 3:
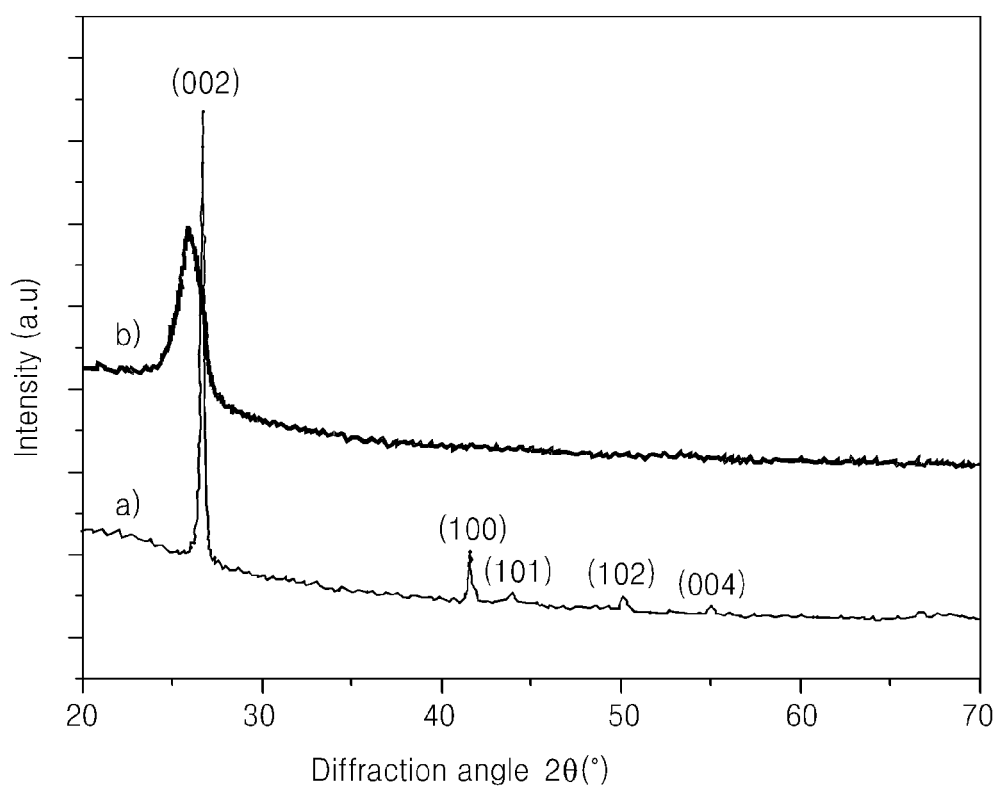
FIG. 3 illustrates results of X-ray diffraction analysis performed on functionalized hexagonal boron nitrides prepared in Preparation Example 1, Preparation Example 1a, Preparation Example 1b, and Preparation Example 2.

The analysis results are shown in FIG. 3. In FIG. 3, a) is related to a bulk hexagonal boron nitride, which is a starting material, and b) is related to a boron nitride to which a OH functional group is bonded as prepared in Preparation Example 1.

Referring to FIG. 3, the boron nitride to which a OH functional group is bonded as prepared in Preparation Example 1 had a (002) crystal face peak which appeared broad and weak compared to that of the bulk hexagonal boron nitride (a parent h-BN), which was a starting material. Also, (100), (101), and (102) crystal face peaks were observed within a range where 2θ is from about 40° to about 50°. In this regard, it may be known that structure ordering of the hexagonal boron nitride was reduced. Also, the functionalized hexagonal boron nitrides prepared in Preparation Example 1a, Preparation Example 1b, and Preparation Example 2 had the same XRD analysis pattern with that of b) in FIG. 3.

From the XRD analysis results of the functionalized hexagonal boron nitrides prepared in Preparation Example 1, Preparation Example 1a, Preparation Example 1b, and Preparation Example 2, 2θs of a (002) face, d-spacings ($d_{002}$), and average particle diameters (La) of crystals were obtained and are shown in Table 1.

The d-spacings were calculated using Bragg's law defined in Equation 1 below, and the average particle diameters of the crystals were calculated using the Scherrer equation defined in Equation 2.

$$d_{002} = \lambda/2 \sin \theta \quad \text{[Equation 1]}$$

$$La = (0.9\lambda)/(\beta \cos \theta) \quad \text{[Equation 2]}$$

In Equations 1 and 2, λ is an X-ray wavelength (1.54 Å) and β is a full width at half maximum (FWHM) at a Bragg's angle.

TABLE 1

| | 2θ(°) | D-spacing ($d_{002}$) (nm) | Average particle diameter (La) of crystals (nm) |
|---|---|---|---|
| Preparation Example 1 | 26.4 | 0.337 | 5.6 |
| Parent h-BN | 26.8 | 0.332 | 23.8 |
| Preparation Example 1a | 26.0 | 0.342 | 6.4 |
| Preparation Example 1b | 25.7 | 0.346 | 6.6 |
| Preparation Example 2 | 26.5 | 0.336 | 8.2 |

Referring to Table 1, it may be known that the functionalized hexagonal boron nitrides prepared in Preparation Example 1, Preparation Example 1a, Preparation Example 1b, and Preparation Example 2 have a structure that is similar to 2θ with respect to a (002) face of the parent h-BN, which is a starting material.

2) Preparation Examples 5 to 7

The two-dimensional carbon nanostructure precursors prepared in Preparation Examples 5 to 7 were XRD analyzed. When performing the XRD analysis, a 12 KW XRD diffractometer available from BRUKER AXS was used, and the analysis conditions included measurement at a rate of about 4° per minute within a range of about 5° to about 80°.

From the XRD analysis results of the two-dimensional carbon nanostructures prepared in Preparation Examples 5 to 7, d-spacings ($d_{002}$) and average particle diameters (La) with respect to the (002) face of the crystals were obtained and are shown in Table 2.

The d-spacings were calculated using Bragg's law defined in Equation 1 below, and the average particle diameters of the crystals were calculated by using the Scherrer equation defined in Equation 2.

TABLE 2

| | D-spacing ($d_{002}$) (nm) | Average particle diameter (La) of crystals (nm) |
|---|---|---|
| Preparation Example 5 | 0.722 | 1.7 |
| Preparation Example 6 | 0.762 | 1.6 |
| Preparation Example 7 | 0.324 | 22.6 |

Evaluation Example 2: Raman Spectrum Analysis

1) Preparation Examples 5 to 7 and Comparative Example 1

Raman spectroscopy analysis was performed on the two-dimensional carbon nanostructures prepared in Preparation Examples 5 to 7 and the high-temperature amorphous carbon prepared in Comparative Example 1. The Raman spectroscopy analysis was performed using the Raman instrument, RM-1000 Invia (514 nm, $Ar^+$ion laser), available from Renishaw. Here, a D peak, a G peak, and a 2D peak respectively are peaks at about 1340 $cm^{-1}$ to about 1350 $cm^{-1}$, at about 1580 $cm^{-1}$, and at about 2700 $cm^{-1}$.

Intensity ratios of a D mode peak to a G mode peak ($I_D/I_G$) of the two-dimensional carbon nanostructures prepared in Preparation Examples 5 to 7, a high-temperature amorphous carbon prepared in Comparative Example 1, and a low-temperature amorphous carbon prepared in Comparative Example 2 were obtained and are shown in Table 3.

| | $I_D/I_G$ |
|---|---|
| Preparation Example 5 | 0.87 |
| Preparation Example 6 | 0.86 |
| Preparation Example 7 | 0.90 |
| Comparative Example 1 | 0.85 |

2) Preparation Example 8

Raman spectroscopy analysis was performed on the tungsten sulfide, to which a hydroxyl group is bonded, prepared in Preparation Example 10.

The Raman spectroscopy analysis was performed using the Raman instrument, RM-1000 Invia (514 nm, $Ar^+$ion laser), available from Renishaw. Also, the result of the Raman spectroscopy analysis performed on the tungsten sulfide, to which a hydroxyl group is bonded, prepared in Preparation Example 10 is shown in FIG. 5, and the Raman spectroscopy analysis of a tungsten sulfide, which is a starting material, is shown in FIG. 4 for the comparison with FIG. 5.

Figure 4:
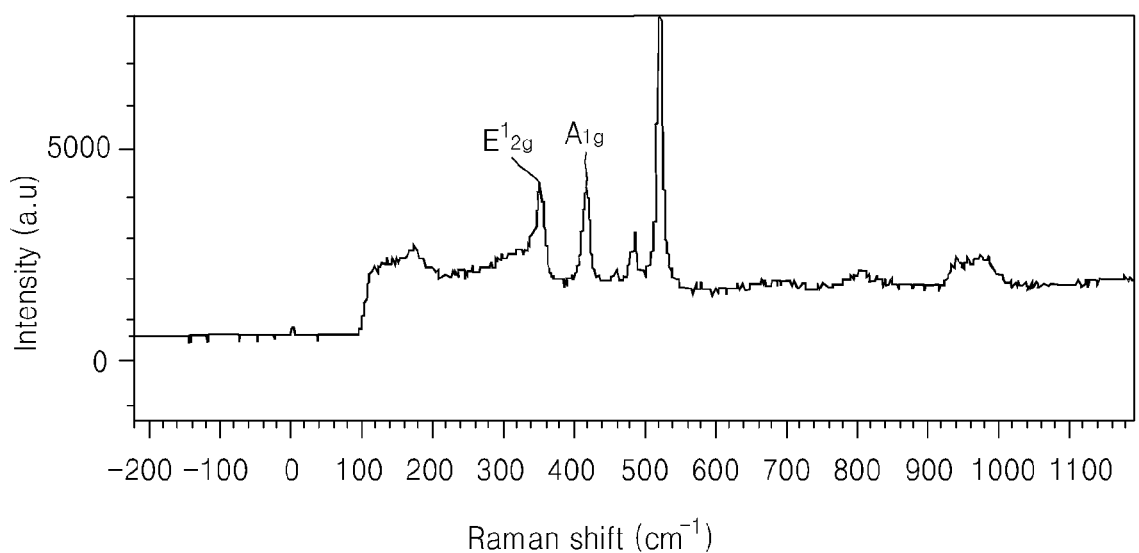
FIG. 4 is a Raman spectrum of tungsten sulfide ($WS_2$)
Figure 5:
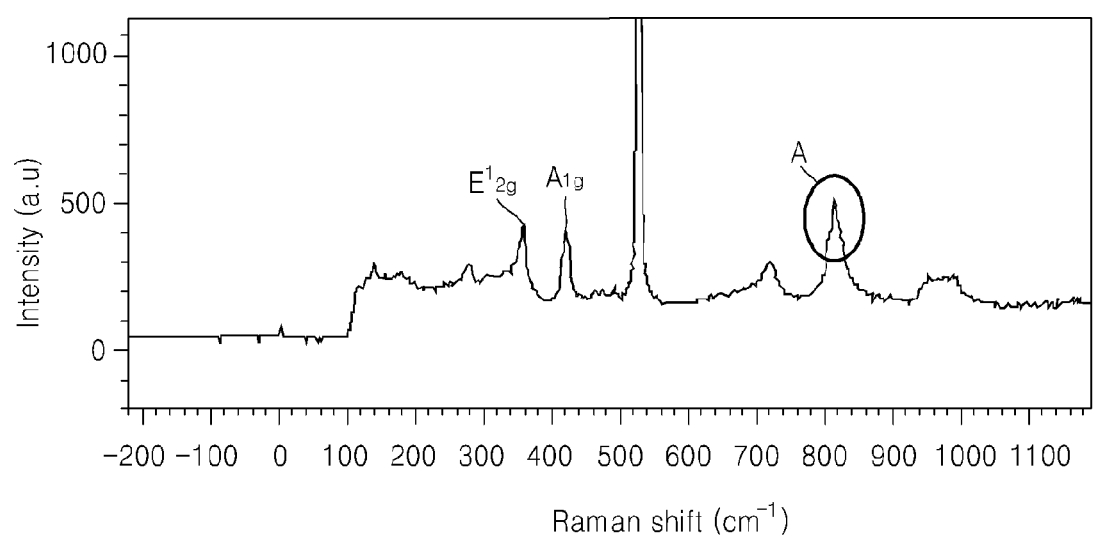
FIG. 5 is Raman spectrum of tungsten sulfide, to which a hydroxyl group is bonded, as prepared in Preparation Example 10.

Referring to FIG. 4, an $E^1_{2g}$ mode peak and an $A_{1g}$ mode peak are each observed at Raman shits of about 355 $cm^{-1}$ and about 420 $cm^{-1}$, and it may be known that the hydroxyl group is bonded to the tungsten sulfide from the peak in the region A.

Evaluation Example 3: XPS Analysis

XPS spectroscopy was performed on the two-dimensional carbon nanostructures prepared in Preparation Examples 5 to 9 and the amorphous carbon prepared in Comparative Example 1 using a Quantum 2000 (Physical Electronics).

The analysis results are shown in Table 4.

TABLE 4

| | XPS | |
|---|---|---|
| | C/O atom ratio | Oxygen content (atom %) |
| Preparation Example 5 | 2.65 | 27.4% |
| Preparation Example 6 | 3.76 | 21.0% |
| Preparation Example 7 | 6.50 | 13.3% |
| Comparative Example 1 | 15.78 | — |

Evaluation Example 4: Etching Resistance

Etching resistance was evaluated by calculating an etching rate of the hardmask when the dry etching is performed using each of the hardmasks prepared in Examples 1 to 5 and Comparative Example 3.

The results of the etching rate evaluation are shown in Table 5.

TABLE 5

| | Etching rate (Å/sec) |
|---|---|
| Example 1 | 9 |
| Example 2 | 14 |
| Example 3 | 19 |
| Example 4 | 13 |
| Example 5 | 13 |
| Comparative Example 3 | 23.0 |

As shown in Table 5, it may be known that etching resistance is better in the case of the hardmask prepared in Examples 1 to 5 compared to the hardmasks prepared in Comparative Example 3.

Evaluation Example 5: Pattern Shape Analysis

Etching was performed using each of the hardmasks prepared in Examples 1 to 5 and Comparative Examples 1 to 3, and then a cross-section of the silicon substrate having a silicon oxide layer pattern was observed using FE-SEM, and the results are shown in Table 6.

TABLE 6

| | Shape of pattern after hardmask etching | Shape of pattern after silicon oxide etching |
|---|---|---|
| Example 1 | Vertical | Vertical |
| Example 2 | Vertical | Vertical |
| Example 3 | Vertical | Vertical |
| Example 4 | Vertical | Vertical |
| Example 5 | Vertical | Vertical |
| Comparative Example 1 | Arched | Tapered |
| Comparative Example 2 | Arched | Tapered |
| Comparative Example 3 | Arched | Tapered |

As shown in Table 6, the silicon oxide layer pattern shapes having each of the hardmasks prepared in Examples 1 to 5 are vertical, unlike that of the hardmask prepared in Comparative Examples 1 to 3.

As described above, a hardmask including a hardmask composition according to example embodiments has improved etching resistance and mechanical strength, and the hardmask may be more easily removed after an etching process. When the hardmask is used, efficiency of a semiconductor process may be improved.

It should be understood that example embodiments described herein should be considered in a descriptive sense only and not for purposes of limitation. Descriptions of features or aspects within each embodiment should typically be considered as available for other similar features or aspects in other embodiments.

While example embodiments have been described with reference to the figures, it will be understood by those of ordinary skill in the art that various changes in form and details may be made therein without departing from the spirit and scope of the following claims.

What is claimed is:
1. A hardmask composition comprising:
   a first material including one of an aromatic ring-containing monomer and a polymer containing a repeating unit including an aromatic ring-containing monomer;
   a second material bonded to the first material by a covalent bond, the second material including at least one of a hexagonal boron nitride and a precursor thereof, a chalcogenide-based material to which a hydroxyl group is bonded and a precursor thereof to which the hydroxyl group is bonded, and a two-dimensional carbon nanostructure and a precursor thereof, the two-dimensional carbon nanostructure containing about 0.01 atom % to about 40 atom % of oxygen, the second material having a functional group bonded thereto; and
   a solvent,
   wherein the hexagonal boron nitride and the precursor thereof is one of a hexagonal boron nitride to which a hydroxyl (—OH) functional group is bonded, a hexagonal boron nitride to which a nitro group (NO$_2$) and a —HSO$_3$ functional group are bonded, a hexagonal boron nitride to which a —HSO$_3$ functional group is bonded, a hexagonal boron nitride to which a —NH$_2$ functional group is bonded, a hexagonal boron nitride to which a —(CH$_2$)$_3$COOH is bonded and a hexagonal boron nitride to which a —CONH$_2$ is bonded,
   wherein the chalcogenide-based material is at least one of molybdenum sulfide (MoS$_2$), tungsten sulfide (WS$_2$), molybdenum selenide (MoSe$_2$), molybdenum telluride (MoTe$_2$), tungsten selenide (WSe$_2$), and tungsten telluride (WTe$_2$), and
   wherein a content of the second material is about 50 parts by weight to about 99.99 parts by weight based on 100 parts by weight of a total weight of the first material and the second material,
wherein the covalent bond is one of an ester group (—C(=O)O—), an ether group (—O—), a thioether group (—S—), and a carbonyl group (—C)=O)—),
   wherein the aromatic ring-containing monomer is at least one of a monomer represented by Group 1 and a monomer represented by Formula 2,

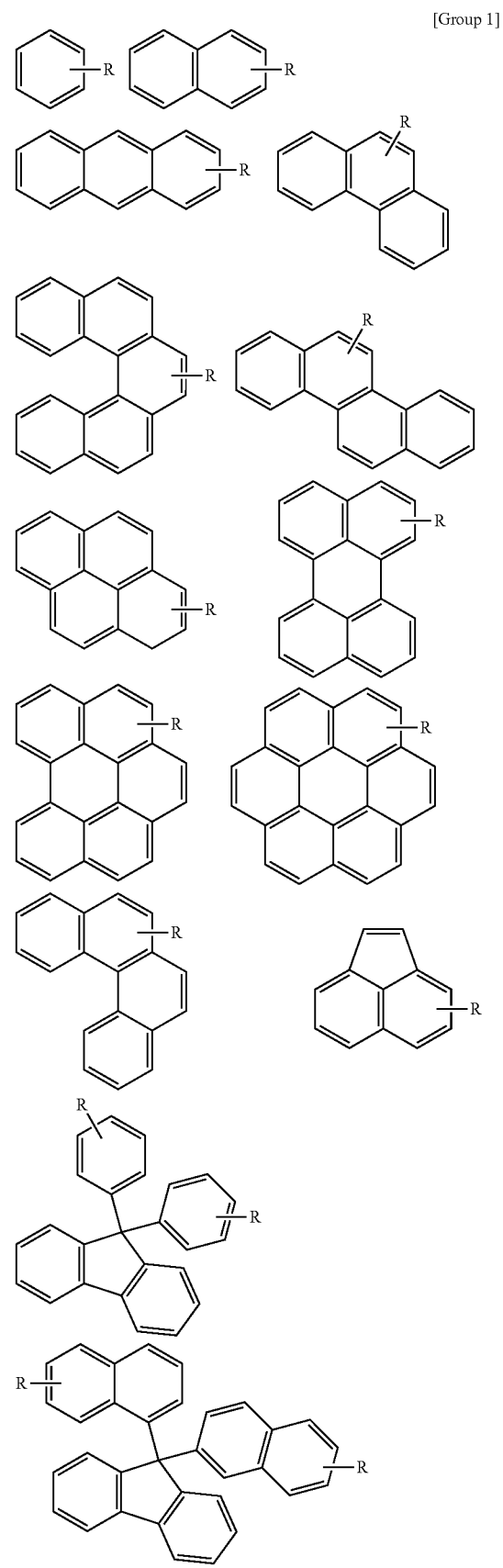

[Group 1]

wherein, in Group 1, R is a mono-substituted or multi-substituted substituent including one of a halogen atom, a hydroxyl group, an isocyanate group, a glycidyloxy group, a carboxyl group, and aldehyde group, an amino group, a siloxane group, and epoxy group, an imino group, an urethane group, an ester group, an epoxy group, an amide group, an imide group, an acryl group, a methacryl group, a nitro group, —HSO$_3$, an unsubstituted or substituted C$_1$-C$_{30}$ saturated organic group, and an unsubstituted or substituted C$_1$-C$_{30}$ unsaturated organic group,

[Formula 2]

A-L-A wherein, in Formula 2, each of A and A' are identical to or different from each other and are independently a monovalent organic group derived from one including one of the monomers represented by Group 1, and L is one of a single bond, a substituted or unsubstituted C$_1$-C$_{30}$ alkylene group, a substituted or unsubstituted C$_2$-C$_{30}$ alkenylene group, a substituted or unsubstituted C$_2$-C$_{30}$ alkynylene group, a substituted or unsubstituted C$_7$-C$_{30}$ arylene alkylene group, a substituted or unsubstituted C$_6$-C$_{30}$ arylene group, a substituted or unsubstituted C$_2$-C$_{30}$ heteroarylene group, a substituted or unsubstituted C$_2$-C$_{30}$ heteroarylene alkylene group, a substituted or unsubstituted C$_1$-C$_{30}$ alkyleneoxy group, a substituted or unsubstituted C$_7$-C$_{30}$ arylenealkyleneoxy group, a substituted or unsubstituted C$_6$-C$_{30}$ aryleneoxy group, a substituted or unsubstituted C$_2$-C$_{30}$ heteroaryleneoxy group, a substituted or unsubstituted C$_2$-C$_{30}$ heteroarylenealkyleneoxy group, —C(═O)—, and —SO2—, and wherein the first material is at least one of a compound represented by Group 3 and a compound represented by Formula 4,

[Group 3]

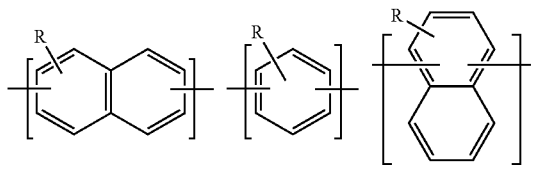

wherein, in Group 3, R is a mono-substituted or multi-substituted substituent including one of a hydrogen atom, a halogen atom, a hydroxyl group, an isocyanate group, a glycidyloxy group, a carboxyl group, an aldehyde group, an amino group, a siloxane group, an epoxy group, an imino group, an urethane group, an ester group, an epoxy group, an amide group, an imide group, an acryl group, a methacryl group, an unsubstituted or substituted C$_1$-C$_{30}$ saturated organic group, and an unsubstituted or substituted C$_1$-C$_{30}$ unsaturated organic group,

[Formula 4]

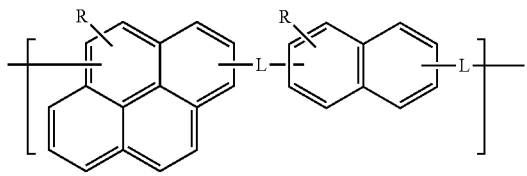

wherein, in Formula 4, R is as defined in Group 3, and L is one of a single bond, a substituted or unsubstituted C$_1$-C$_{30}$ alkylene group, a substituted or unsubstituted C$_2$-C$_{30}$ alkenylene group, a substituted or unsubstituted C$_2$-C$_{30}$ alkynylene group, a substituted or unsubstituted C$_7$-C$_{30}$ arylene alkylene group, a substituted or unsubstituted C$_6$-C$_{30}$ arylene group, a substituted or unsubstituted C$_2$-C$_{30}$ heteroarylene group, a substituted or unsubstituted C$_2$-C$_{30}$ heteroarylene alkylene group, a substituted or unsubstituted C$_1$-C$_{30}$ alkyleneoxy group, a substituted or unsubstituted C$_7$-C$_{30}$ arylenealkyleneoxy group, a substituted or unsubstituted C$_6$-C$_{30}$ aryleneoxy group, a substituted or unsubstituted C$_2$-C$_{30}$ heteroaryleneoxy group, a substituted or unsubstituted C$_2$-C$_{30}$ heteroarylenealkyleneoxy group, —C(═O)—, and —SO$_2$—.

2. The hardmask composition of claim 1, wherein the first material and the second material include at least one of a hydroxyl group, a carboxyl group, an amino group, —Si(R$_1$)(R$_2$)(R$_3$) (where, R$_1$, R$_2$, and R$_3$ are each independently a hydrogen atom, a hydroxyl group, a C$_1$-C$_{30}$ alkyl group, a C$_1$-C$_{30}$ alkoxy group, a C$_6$-C$_{30}$ aryl group, a C$_6$-C$_{30}$ aryloxy group, or a halogen atom), a thiol group (—SH), —Cl, —C(═O)Cl, —SCH$_3$, a halogen atom, an isocyanate group, a glycidyloxy group, an aldehyde group, an epoxy group, an imino group, an urethane group, an ester group, an amide group, an imide group, an acryl group, a methacryl group, —(CH$_2$)$_n$COOH (where, n is an integer of 1 to 10), —CONH$_2$, an unsubstituted or substituted C$_1$-C$_{30}$ saturated organic group, and an unsubstituted or substituted C$_1$-C$_{30}$ unsaturated organic group.

3. The hardmask composition of claim 1, wherein the precursor of the two-dimensional carbon nanostructure includes one of expanded graphite obtained from exfoliated graphite and a product obtained by oxidizing acid-treated graphite.

4. The hardmask composition of claim 1, wherein
the two-dimensional carbon nanostructure and the precursor thereof has an intensity ratio of a D mode peak to a G mode peak of about 2 or lower, and
the two-dimensional carbon nanostructure and the precursor thereof has an intensity ratio of a 2D mode peak to a G mode peak of about 0.01 or higher as obtained from Raman spectroscopy analysis.

5. The hardmask composition of claim 1, wherein
the two-dimensional carbon nanostructure includes a two-dimensional layered structure having a (002) crystal face peak observed with a diffraction angle within a range of about 20° to about 27°, and
the two-dimensional carbon nanostructure has a d-spacing in a range of about 0.3 to about 0.5 nm as a result of X-ray diffraction analysis.

6. The hardmask composition of claim 1, wherein the solvent is at least one of water, methanol, isopropanol, ethanol, N,N-dimethylformamide, N-methylpyrrolidone, dichloroethane, dichlorobenzene, N,N-dimethylsulfoxide, xylene, aniline, propylene glycol, propylene glycol diacetate, methoxypropanediol, diethyleneglycol, gamma-butyrolactone, acetylacetone, cyclohexanone, propylene glycol monomethyl ether acetate, γ-butyrolactone, dichloroethane, O-dichlorobenzene, nitromethane, tetrahydrofuran, nitromethane, dimethyl sulfoxide, nitrobenzene, butyl nitrite, methylcellosolve, ethylcellosolve, diethylether, diethyleneglycolmethylether, diethyleneglycolethylether, dipropyleneglycolmethylether, toluene, xylene, hexane, methylethylketone, methylisoketone, hydroxymethylcellulose, and heptanes.

7. The hardmask composition of claim 1, wherein the first material is one of the compounds represented by Formulae 6c to 6e:

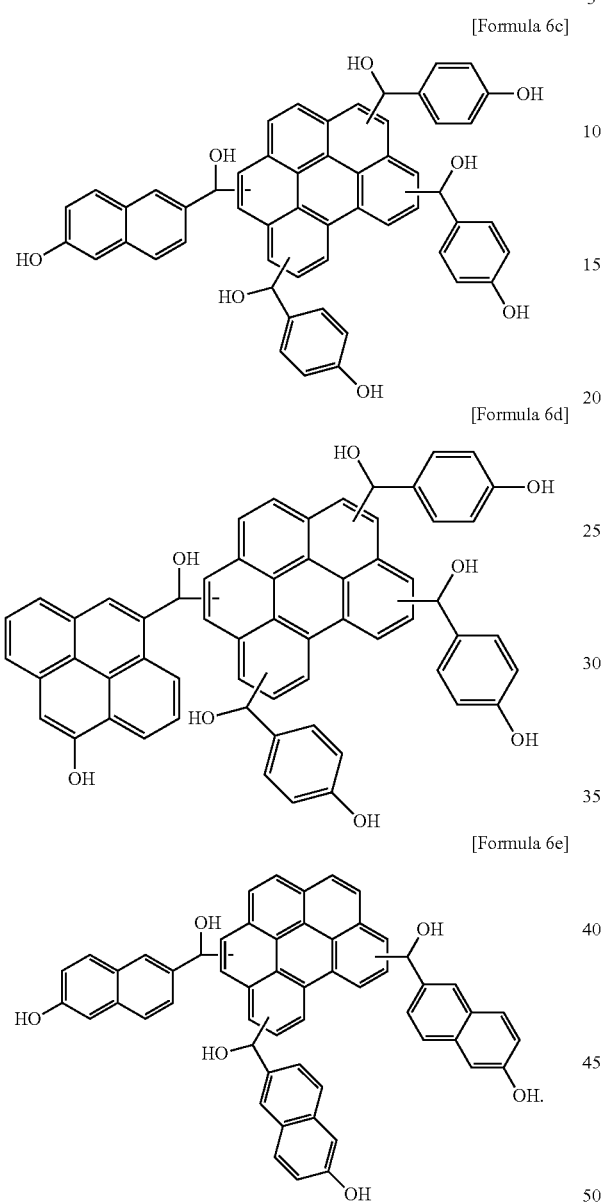

[Formula 6c]

[Formula 6d]

[Formula 6e]

8. A method of forming a pattern, the method comprising:
forming a layer on a substrate;
forming a hardmask by providing a hardmask composition on the layer, the hardmask composition including,
 a first material including one of an aromatic ring-containing monomer and a polymer containing a repeating unit including an aromatic ring-containing monomer;
 a second material bonded to the first material by a covalent bond, the second material including at least one of a hexagonal boron nitride and a precursor thereof, a chalcogenide-based material to which a hydroxyl group is bonded and a precursor thereof to which the hydroxyl group is bonded, and a two-dimensional carbon nanostructure and a precursor thereof, the two-dimensional carbon nanostructure containing about 0.01 atom % to about 40 atom % of oxygen, the second material having a functional group bonded thereto; and
 a solvent,
 wherein the hexagonal boron nitride and the precursor thereof is one of a hexagonal boron nitride to which a hydroxyl (—OH) functional group is bonded, a hexagonal boron nitride to which a nitro group ($NO_2$) and a —$HSO_3$ functional group are bonded, a hexagonal boron nitride to which a —$HSO_3$ functional group is bonded, a hexagonal boron nitride to which a —$NH_2$ functional group is bonded, a hexagonal boron nitride to which a —$(CH_2)_3COOH$ is bonded and a hexagonal boron nitride to which a —$CONH_2$ is bonded, and
 wherein the chalcogenide-based material is at least one of molybdenum sulfide ($MoS_2$), tungsten sulfide ($WS_2$), molybdenum selenide ($MoSe_2$), molybdenum telluride ($MoTe_2$), tungsten selenide ($WSe_2$), and tungsten telluride ($WTe_2$);
forming a photoresist layer on the hardmask;
forming a hardmask pattern on the layer by etching the hardmask using the photoresist layer as an etching mask, the hardmask pattern including a composite, the composite including,
 the polymer containing the repeating unit including the aromatic ring-containing monomer, and
 the at least one of the hexagonal boron nitride, the chalcogenide-based material, and the two-dimensional carbon nanostructure connected to the polymer by a chemical bond; and
etching the layer using the hardmask pattern as an etching mask.

9. The method of claim 8, wherein the forming a hardmask includes coating a top surface of the layer with the hardmask composition including the two-dimensional carbon nanostructure containing about 0.01 atom % to about 40 atom % of oxygen.

10. The method of claim 9, wherein the coating includes heat-treating the coated layer during or after the coating.

11. The method of claim 8, wherein the forming a hardmask includes:
providing the hardmask composition including the precursor of the two-dimensional carbon nanostructure;
coating a top surface of the layer with the hardmask composition to form a coated layer on the top surface of the layer, and
oxidizing or reducing the coated layer.

12. The method of claim 9, wherein
the reducing the coated layer includes one of chemical reduction, reduction by heat-treatment, and electrochemical reduction, and
the oxidizing the coated layer includes using at least one of an acid, an oxidizing agent, UV, ozone, IR, heat-treatment, and plasma.

13. The method of claim 9, wherein the forming the hardmask pattern forms the hardmask pattern including the two-dimensional carbon nanostructure by stacking two-dimensional nanocrystalline carbon.

14. A hardmask composition comprising:
a first material including one of an aromatic ring-containing monomer and a polymer containing a repeating unit including an aromatic ring-containing monomer;
a second material bonded to the first material by a covalent bond, the second material including a two-dimensional carbon nanostructure and a precursor thereof, the two-dimensional carbon nanostructure containing about 0.01 atom % to about 40 atom % of oxygen, the second material having a functional group bonded thereto; and a solvent, wherein a content of the second material is about 50 parts by weight to about 99.99 parts by weight based on 100 parts by weight of a total weight of the first material and the second material, and the covalent bond is one of an ester group (—C(=O)O—), an ether group (—O—), a thioether group (—S—), a carbonyl group (—C(=O)—), and an amide group (—C(=O)NH—).

* * * * *